United States Patent
Colles et al.

(10) Patent No.: US 11,496,121 B2
(45) Date of Patent: Nov. 8, 2022

(54) COMBINING VOLTAGE RAMPS TO CREATE LINEAR VOLTAGE RAMP

(71) Applicant: Silanna Asia Pte Ltd, Singapore (SG)

(72) Inventors: Joseph H. Colles, Bonsall, CA (US); Steven E. Rosenbaum, San Diego, CA (US)

(73) Assignee: Silanna Asia Pte Ltd, Singapore (SG)

( * ) Notice: Subject to any disclaimer, the term of this patent is extended or adjusted under 35 U.S.C. 154(b) by 0 days.

(21) Appl. No.: 17/248,873

(22) Filed: Feb. 11, 2021

(65) Prior Publication Data
US 2021/0167763 A1 Jun. 3, 2021

Related U.S. Application Data

(63) Continuation of application No. 16/384,632, filed on Apr. 15, 2019, now Pat. No. 10,924,092.

(51) Int. Cl.
*H03K 4/50* (2006.01)
*H03K 7/08* (2006.01)

(52) U.S. Cl.
CPC .............. *H03K 4/50* (2013.01); *H03K 7/08* (2013.01)

(58) Field of Classification Search
None
See application file for complete search history.

(56) References Cited

U.S. PATENT DOCUMENTS

| | | | |
|---|---|---|---|
| 5,717,350 A | 2/1998 | Bohrer | |
| 5,760,623 A | 6/1998 | Hastings | |
| 7,948,280 B2 | 5/2011 | Dwarakanath et al. | |
| 8,803,569 B1 | 8/2014 | Malladi et al. | |
| 9,841,776 B1 | 12/2017 | Bari et al. | |
| 10,924,092 B2* | 2/2021 | Colles | H03K 4/50 |
| 2007/0132508 A1 | 6/2007 | Rice | |
| 2007/0210782 A1 | 9/2007 | Prexl et al. | |
| 2010/0007395 A1 | 1/2010 | Sugie | |
| 2013/0256511 A1 | 10/2013 | Kim | |
| 2013/0307594 A1 | 11/2013 | Hatanaka et al. | |
| 2018/0191333 A1 | 7/2018 | Chen et al. | |
| 2019/0356223 A1 | 11/2019 | Chang et al. | |
| 2020/0099879 A1 | 3/2020 | Kim | |

OTHER PUBLICATIONS

Ex parte Quayle Action dated Jul. 27, 2020 for U.S. Appl. No. 16/384,632.
Notice of Allowance dated Oct. 21, 2020 for U.S. Appl. No. 16/384,632.

* cited by examiner

*Primary Examiner* — Cassandra F Cox
(74) *Attorney, Agent, or Firm* — MLO, a professional corp.

(57) ABSTRACT

An improved ramp generator enables a very high degree of linearity in an output voltage ramp signal. Output ramps of the output voltage ramp signal are alternatingly produced from two preliminary ramp signals during alternating time periods. Preliminary ramps are produced at different preliminary ramp nodes that are alternatingly connected to an output node. The preliminary ramps continuously ramp during and in some cases beyond, e.g., before and/or after, the time periods. In some embodiments, switches alternatingly connect two capacitors to at least one current source, a reset voltage source, and the output node to alternatingly produce the preliminary ramps.

20 Claims, 5 Drawing Sheets

COMBINING VOLTAGE RAMPS TO CREATE LINEAR VOLTAGE RAMP

RELATED APPLICATIONS

This application is a continuation of U.S. patent application Ser. No. 16/384,632 filed on Apr. 15, 2019 and entitled "Combining Voltage Ramps to Create Linear Voltage Ramp", which is hereby incorporated by reference for all purposes.

BACKGROUND

Voltage ramp signals have a variety of uses in electronic circuits. For example, high speed switching regulators frequently require a pulse width modulator (PWM) circuit, and a primary component of a high speed PWM circuit is a ramp (or sawtooth) generator that produces a sawtooth voltage ramp signal.

A common design for generating a voltage ramp signal uses a capacitor repeatedly charged by a current source, such that the voltage on the capacitor increases like a ramp waveform. Some PWM circuits use such a voltage ramp signal with two comparators to detect two points of the ramp. The two comparators then control a set reset flip-flop to create a clock signal for the PWM circuit.

Most highspeed ramp generators, however, suffer from limited slew time to discharge the capacitor and thereby reset the ramp at the end of each ramp period, which gives the voltage ramp signal its characteristic sawtooth waveform. Additionally, a fast discharge creates ringing, over shoot, and under shoot within the voltage ramp signal, which severely limits the linearity of the ramp. High quality linearity is an important characteristic of a good voltage ramp signal. Nonlinearity or poor linearity of the ramp generator of the PWM circuit, on the other hand, is a common problem that limits the speed of a switching regulator and causes harmonic distortion of the regenerated signal.

SUMMARY

In accordance with some embodiments, an improved ramp generator that enables a very high degree of linearity in the ramp signal includes an output node and first and second preliminary ramp nodes. An output voltage ramp signal is produced at the output node. The output voltage ramp signal has first continuous ramp periods and second continuous ramp periods that alternate with each other. The first continuous ramp periods are produced from first preliminary ramp periods of a first preliminary voltage ramp signal during first time periods. The second continuous ramp periods are produced from second preliminary ramp periods of a second preliminary voltage ramp signal during second time periods. The first and second time periods alternate with each other. The first preliminary voltage ramp signal is generated at the first preliminary ramp node. The first preliminary ramp node is periodically electrically connected to the output node during the first time periods. Each of the first preliminary ramp periods has a first preliminary voltage ramp that continuously ramps during and beyond the first time periods. The second preliminary voltage ramp signal is generated at the second preliminary ramp node. The second preliminary ramp node is periodically electrically connected to the output node during the second time periods. Each of the second preliminary ramp periods has a second preliminary voltage ramp that continuously ramps during and beyond the second time periods.

In some embodiments, an improved ramp generator includes an output node, first and second capacitors, first and second current sources, and a set of switches. An output voltage ramp signal is produced at the output node. The output voltage ramp signal has first continuous output voltage ramps and second continuous output voltage ramps that alternate with each other. The first continuous output voltage ramps are produced from first preliminary voltage ramps of a first preliminary voltage ramp signal during first time periods. The second continuous output voltage ramps are produced from second preliminary voltage ramps of a second preliminary voltage ramp signal during second time periods. The first and second time periods alternate with each other. The first capacitor has a first capacitor node at which the first preliminary voltage ramp signal is generated. The second capacitor has a second capacitor node at which the second preliminary voltage ramp signal is generated. The first current source is electrically connected to the first capacitor at the first capacitor node to generate the first preliminary voltage ramp signal by periodically charging the first capacitor to generate the first preliminary voltage ramps. The second current source is electrically connected to the second capacitor at the second capacitor node to generate the second preliminary voltage ramp signal by periodically charging the second capacitor to generate the second preliminary voltage ramps. The set of switches enable the generation of the first preliminary voltage ramps at least during the first time periods, electrically connect the first capacitor node to the output node to produce the first continuous output voltage ramps during the first time periods, enable the generation of the second preliminary voltage ramps at least during the second time periods, and electrically connect the second capacitor node to the output node to produce the second continuous output voltage ramps during the second time periods.

In some embodiments, an improved ramp generator includes an output node and first and second capacitors. An output voltage ramp signal is produced at the output node. The output voltage ramp signal has first continuous ramp periods and second continuous ramp periods that alternate with each other. The first continuous ramp periods are produced from first preliminary ramp periods of a first preliminary voltage ramp signal during first time periods. The second continuous ramp periods are produced from second preliminary ramp periods of a second preliminary voltage ramp signal during second time periods. The first and second time periods alternate with each other. The first capacitor has a first capacitor node at which the first preliminary voltage ramp signal is generated. The first capacitor node is periodically electrically connected to the output node. Each of the first preliminary ramp periods has a first preliminary voltage ramp that continuously ramps by charging the first capacitor during the first time periods. The first preliminary voltage ramp resets to a nonzero initial voltage by partially discharging the first capacitor during the second time periods. The second capacitor has a second capacitor node at which the second preliminary voltage ramp signal is generated. The second capacitor node is periodically electrically connected to the output node alternatingly with the first capacitor node. Each of the second preliminary ramp periods has a second preliminary voltage ramp that continuously ramps by charging the second capacitor during the second time periods. The second preliminary voltage ramp resets to the nonzero initial voltage by partially discharging the second capacitor during the first time periods.

In some embodiments, the first and second continuous ramp periods have first and second continuous voltage ramps, respectively, that are produced from initial linear portions of corresponding first and second preliminary voltage ramps, respectively. In some embodiments, the first and second preliminary voltage ramps continuously ramp during and after the first and second time periods, respectively. In some embodiments, output voltage ramps of the output voltage ramp signal continuously ramp from a first voltage level to a second voltage level, and the first and second preliminary voltage ramps continuously ramp from the first voltage level to greater than the second voltage level. In some embodiments, the first and second continuous ramp periods have first and second continuous voltage ramps, respectively, that are produced from middle linear portions of corresponding first and second preliminary voltage ramps, respectively. In some embodiments, the first and second preliminary voltage ramps continuously ramp before, during and after the first and second time periods, respectively.

In some embodiments, the switches include first and second reset switches, first and second output switches, and optionally, first and second ramp generator switches. In some embodiments, the ramp generator has one or two current sources.

DETAILED DESCRIPTION

Figure 1:
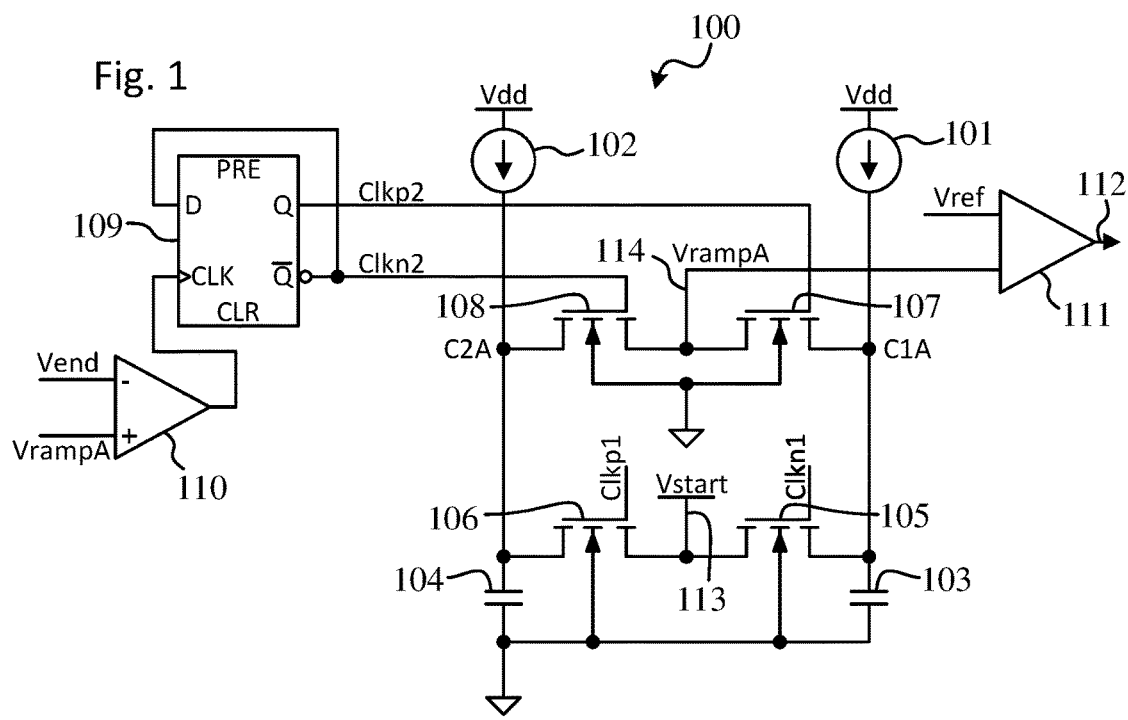
FIG. 1 is a simplified schematic diagram of an example improved ramp generator, in accordance with some embodiments.

Embodiments of the ramp generators described herein produce an output voltage ramp signal from two initial or preliminary voltage ramp signals. By multiplexing between the two preliminary voltage ramp signals during first and second alternating output ramp periods of the output voltage ramp signal, the ramp generator alternates between using the first preliminary voltage ramp signal to produce the output voltage ramp signal during the first output ramp periods and using the second preliminary voltage ramp signal to produce the output voltage ramp signal during the second output ramp periods.

In some embodiments, the two preliminary voltage ramp signals are generated by alternatingly charging two separate (preferably identical) capacitors. The capacitors are charged alternatingly, so that individual first and second preliminary voltage ramps of the first and second preliminary voltage ramp signals, respectively, are produced alternatingly and 180 degrees out of phase with each other. Thus, the first preliminary voltage ramps of the first preliminary voltage ramp signal occur during (or overlap) the first output ramp periods of the output voltage ramp signal, and the second preliminary voltage ramps of the second preliminary voltage ramp signal occur during (or overlap) the second output ramp periods of the output voltage ramp signal.

By using two capacitors and multiplexing between the preliminary voltage ramp signals generated thereby, the return or reset time of each of the individual preliminary voltage ramps within the preliminary ramp periods of the preliminary voltage ramp signals does not have to be very fast. Instead, the reset time can be relatively slow, as long as the capacitor (and, thus, the voltage level of each preliminary voltage ramp) is fully reset before the end of each preliminary ramp period. By allowing the reset time to be relatively slow, the noise or nonlinearity that is typically generated by a fast return slew can be eliminated or greatly reduced within the individual preliminary voltage ramps. Additionally, when the ramp generator switches from one preliminary voltage ramp signal to the other, the current preliminary voltage ramp of the selected preliminary voltage ramp signal is already stable and at the starting or initial voltage of the output voltage ramp signal.

In this manner, the output voltage ramps generated from the preliminary voltage ramps have a very high degree of linearity. Additionally, in some embodiments, another ramp generator uses two of these output voltage ramp signals as preliminary voltage ramp signals for generating yet another output voltage ramp signal having an even higher degree of linearity.

As used herein, the term "voltage ramp signal" refers to an overall signal with a voltage level that repeatedly ramps (up or down, depending on the embodiment). An "output voltage ramp signal" is, thus, the voltage ramp signal that is output by any of the ramp generators described herein. A "preliminary voltage ramp signal" or "initial voltage ramp signal," on the other hand, is a voltage ramp signal within any of the ramp generators described herein and from which the output voltage ramp signal is generated. The output voltage ramp signal for each ramp generator is formed from two initial or preliminary voltage ramp signals. Additionally, in some embodiments of FIGS. 7-10, each preliminary voltage ramp signal is further formed from two initial voltage ramp signals.

Each (output, preliminary or initial) voltage ramp signal includes a series of cycles or periods (i.e., "ramp periods"), each (output, preliminary or initial) ramp period having a single, individual continuous (output, preliminary or initial) "voltage ramp" that continuously ramps (up or down) from a first voltage level to a second voltage level within either the entire ramp period or at least a portion of the ramp period. A "continuous ramp period" is a ramp period within which the voltage ramp continuously ramps throughout the entire ramp period, i.e., without resetting the voltage ramp, except at the beginning or end of the period. On the other hand, some of the initial or preliminary voltage ramp signals (e.g., for FIGS. 1-6) have ramp periods ("initial ramp periods" or "preliminary ramp periods") that include a first portion (a "continuous ramp portion") within which the initial or preliminary voltage ramp continuously ramps (i.e., from a first voltage level to a second voltage level) and a second portion (a "non-ramp portion," "flat portion" or "reset portion") within which the voltage level is held flat (i.e., relatively unchanging) at a reset or initial level at which the voltage ramp begins, which may be the first voltage level. A continuous ramp period, therefore, has a continuous ramp portion, without a non-ramp portion. An initial or preliminary ramp period, on the other hand, either can have only a continuous ramp portion (as a continuous ramp period) or can have both a continuous ramp portion and a non-ramp portion, depending on the embodiment being described.

The output ramp periods of the output voltage ramp signal of each ramp generator described herein include only continuous ramp periods. In embodiments of FIGS. 1-6, the initial or preliminary ramp periods of each initial or preliminary voltage ramp signal include a continuous ramp portion and a non-ramp portion. Additionally, in some embodiments of FIGS. 7-10, each preliminary voltage ramp signal (from which the output voltage ramp signal is formed) includes preliminary ramp periods that have only a continuous ramp portion (i.e., only continuous ramp periods), and each initial voltage ramp signal (from which the preliminary voltage ramp signals are formed) includes initial ramp periods that have a continuous ramp portion and a non-ramp portion.

An example improved ramp generator 100 is shown in FIG. 1, in accordance with some embodiments. The ramp generator 100 generally includes first and second current sources 101 and 102, first and second capacitors 103 and 104, first and second reset switches 105 and 106, first and second output switches 107 and 108, a D flip-flop 109, and a comparator 110, among other components not shown for simplicity. The ramp generator 100 generates an output voltage ramp signal VrampA, which ramps from a first (or start, initial, lower, minimum, or bottom) voltage level to a second (or end, final, upper, maximum, or top) voltage level. The output voltage ramp signal VrampA is typically provided to any appropriate downstream electronic component, e.g., an amplifier or a downstream comparator 111 that compares the output voltage ramp signal VrampA with a reference voltage Vref to generate a voltage pulse signal 112. For an application or circuit design that uses a relatively short duration voltage pulse (e.g., a few nanoseconds long) and/or that requires high precision in the rising and falling edges of the voltage pulse, the precision and linearity of the voltage ramp signal is of great importance in order to ensure that the comparator 111 is triggered at the precise required timing points. The output voltage ramp signal VrampA is a very precise and linear voltage ramp signal that can be used in such applications.

The first current source 101 is connected between a voltage supply Vdd and a node C1A (e.g., an anode) of the first capacitor 103. A cathode of the first capacitor 103 is connected to ground. The first reset switch 105 may be a MOSFET (e.g., NMOS) device with source and drain connected between the node C1A and a reset voltage node 113, body connected to ground, and gate connected to clock Clkn1. The first output switch 107 may be a MOSFET (e.g., NMOS) device with source and drain connected between the node C1A and an output node 114, body connected to ground, and gate connected to clock Clkp2.

The second current source 102 is connected between the voltage supply Vdd and a node C2A (e.g., an anode) of the second capacitor 104. A cathode of the second capacitor 104 is connected to ground. The second reset switch 106 may be a MOSFET (e.g., NMOS) device with source and drain connected between the node C2A and the reset voltage node 113, body connected to ground, and gate connected to clock Clkp1. The second output switch 108 may be a MOSFET (e.g., NMOS) device with source and drain connected between the node C2A and the output node 114, body connected to ground, and gate connected to clock Clkn2.

The reset voltage node 113 is connected to receive a start voltage Vstart (having a first voltage level). The comparator 110 is connected to receive an end voltage Vend (having a second voltage level greater than the first voltage level in some embodiments) at a negative input thereof. A voltage level of the start voltage Vstart is approximately the first (or initial, lower, or bottom) voltage level of the output voltage ramp signal VrampA. The start voltage Vstart is a baseline voltage, which can be either a positive voltage, ground, or nonzero voltage. A voltage level of the end voltage Vend is approximately the second (end, final, upper, maximum, or top) voltage level of the output voltage ramp signal VrampA. Delays within some of the components of the ramp generator 100 may cause the second (or final, upper, or top) voltage level of the output voltage ramp signal VrampA not to be exactly the same as, but slightly greater than, the voltage level of the end voltage Vend.

The comparator 110 is also connected to the output node 114 to receive the output voltage ramp signal VrampA at a positive input thereof. An output of the comparator 110 is connected to a clock input CLK of the D flip-flop 109. An input D of the D flip-flop 109 is connected to an inverted output $\overline{Q}$ of the D flip-flop 109. An output Q of the D flip-flop 109 produces the clock Clkp2, and the inverted output $\overline{Q}$ produces the clock Clkn2. Thus, the clocks Clkp2 and Clkn2 are inversions of each other. In some embodiments, the clocks Clkp1 and Clkn1 can be the same as, and connected directly to, the clocks Clkp2 and Clkn2. However, in the illustrated embodiment, the clocks Clkp1 and Clkn1 are separate from each other, separate from the clocks Clkp2 and Clkn2, synchronized to the clocks Clkp2 and Clkn2, respectively, and have a duty cycle of 50% or less, as illustrated in FIG. 2.

The first initial or preliminary voltage ramp signal for the ramp generator 100 is produced at the node C1A (i.e., a first capacitor node or a first preliminary ramp node). The second initial or preliminary voltage ramp signal for the ramp generator 100 is produced at the node C2A (i.e., a second capacitor node or a second preliminary ramp node). The output voltage ramp signal VrampA is produced at the output node 114. Generation of the first and second preliminary voltage ramp signals and the output voltage ramp signal VrampA are described with reference to FIGS. 1 and 2.

Figure 2:
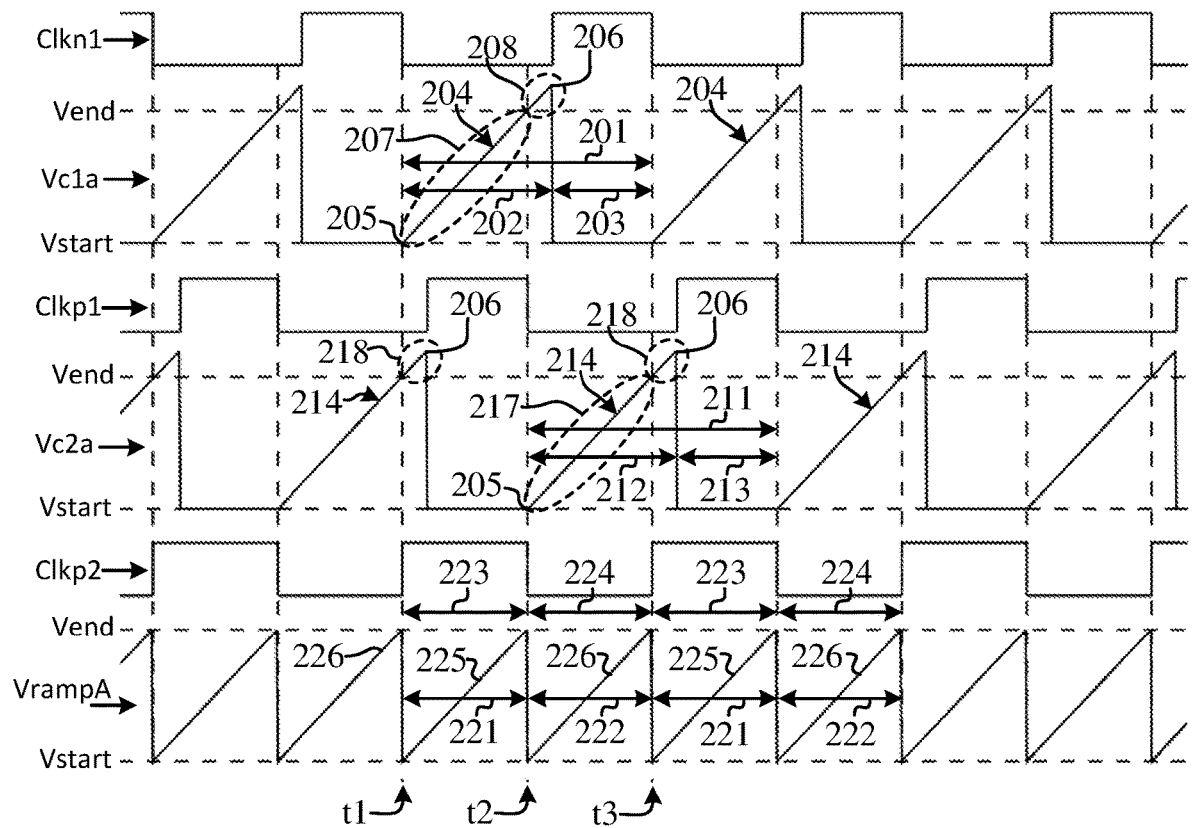
FIG. 2 shows example timing diagrams for operation of the example ramp generator shown in FIG. 1, in accordance with some embodiments.

FIG. 2 shows example timing diagrams for the output voltage ramp signal VrampA, the first preliminary voltage ramp signal (Vc1$a$), the second preliminary voltage ramp signal (Vc2$a$), the clock Clkn1, the clock Clkp1, and the clock Clkp2. Additionally, the clock Clkn2 is simply the inversion of the clock Clkp2, so its timing diagram is omitted for simplicity. The timing diagrams were generated by a simulation running at about 100 MHz with the start voltage Vstart at about one volt and the end voltage Vend at about two volts.

As shown in FIG. 2, the first preliminary voltage ramp signal Vc1$a$ has preliminary ramp periods (e.g., 201) that include a continuous ramp portion (e.g., 202) and a non-ramp portion (e.g., 203). Each first preliminary voltage ramp (e.g., 204) (of the first preliminary voltage ramp signal Vc1$a$) continuously ramps from a first voltage level 205 to a second voltage level 206 within the continuous ramp portion 202. The voltage level of the first preliminary voltage ramp signal Vc1a is held flat (i.e., relatively unchanging) at the first voltage level 205 within the non-ramp portion 203. (It is understood that the first preliminary voltage ramp signal Vc1a is shown as an idealized ramp signal having straight lines with no curve when reset or noise at the start or end of the ramps and resets. However, the real-world ramp signal may exhibit such curves and/or noise.) The first voltage level 205 is generally the same as the start voltage Vstart, which is the reset or initial level at which the first preliminary voltage ramps 204 begin. The second voltage level 206 of the first preliminary voltage ramps 204 is shown as being greater or higher than the end voltage Vend (i.e., the second, end, final, upper, maximum, or top voltage level of the output voltage ramp signal VrampA). Thus, the first preliminary voltage ramps 204 have an initial (linear) portion (e.g., 207) (i.e., between the first voltage level 205 and the end voltage Vend) and a final (also potentially linear) portion (e.g., 208) (i.e., between the end voltage Vend and the second voltage level 206). In other words, the first preliminary voltage ramps 204 continuously ramp from the voltage level of the start voltage Vstart to a voltage level greater than the end voltage Vend in some embodiments.

Similar to the first preliminary voltage ramp signal Vc1a, the second preliminary voltage ramp signal Vc2a (180 degrees out of phase with the first preliminary voltage ramp signal Vc1a) has preliminary ramp periods (e.g., 211) that include a continuous ramp portion (e.g., 212) and a non-ramp portion (e.g., 213). Each second preliminary voltage ramp (e.g., 214) (of the second preliminary voltage ramp signal Vc2a) continuously ramps from the first voltage level 205 to the second voltage level 206 within the continuous ramp portion 212. The voltage level of the second preliminary voltage ramp signal Vc2a is held flat (i.e., relatively unchanging) at the first voltage level 205 within the non-ramp portion 213. (It is understood that the second preliminary voltage ramp signal Vc2a is shown as an idealized ramp signal having straight lines with no curve when reset or noise at the start or end of the ramps and resets. However, the real-world ramp signal may exhibit such curves and/or noise.) The first voltage level 205 is, thus, also the reset or initial level at which the second preliminary voltage ramps 214 begin. The second voltage level 206 of the second preliminary voltage ramps 214 is shown as being greater or higher than the end voltage Vend (i.e., the second, end, final, upper, maximum, or top voltage level of the output voltage ramp signal VrampA). Thus, the second preliminary voltage ramps 214 have an initial (linear) portion (e.g., 217) (i.e., between the first voltage level 205 and the end voltage Vend) and a final (also potentially linear) portion (e.g., 218) (i.e., between the end voltage Vend and the second voltage level 206). In other words, like the first preliminary voltage ramps 204, the second preliminary voltage ramps 214 continuously ramp from the voltage level of the start voltage Vstart to a voltage level greater than the end voltage Vend in some embodiments. (The ends of the first and second preliminary voltage ramps 204 and 214 overscan the end voltage Vend.)

The second preliminary ramp periods 211 are about the same as the first preliminary ramp periods 201, the second continuous ramp portion 212 is about the same as the first continuous ramp portion 202, the second non-ramp portion 213 is about the same as the first non-ramp portion 203, the second preliminary voltage ramps 214 are about the same as the first preliminary voltage ramps 204, the second initial portion 217 is about the same as the first initial portion 207, and the second final portion 218 is about the same as first the final portion 208.

In the illustrated example, the clock Clkn1 and the clock Clkp1 (which are 180 degrees out of phase with each other) have clock periods that are about the same as the preliminary ramp periods 201 and 211 (which are also 180 degrees out of phase with each other), respectively. Additionally, the duty cycle of the clocks Clkn1 and Clkp1 is shown as being less than 50%. (In other embodiments, the duty cycle of the clocks Clkn1 and Clkp1 can be about equal to 50%, such that the continuous ramp portions 202 and 212 and the non-ramp portions 203 and 213 are about equal to each other, the final portions 208 and 218 are almost nonexistent, and the second voltage level 206 is about the same as the end voltage Vend.) The clock Clkp2 (and, thus, also the clock Clkn2) also has a clock period that is about the same as the preliminary ramp periods 201 and 211, but it is shown with about a 50% duty cycle.

The output voltage ramp signal VrampA has first and second continuous output ramp periods (e.g., 221 and 222) during first and second time periods (e.g., 223 and 224), respectively. The first and second continuous output ramp periods 221 and 222 have first and second continuous output voltage ramps (e.g., 225 and 226), respectively, that continuously ramp from the first voltage level of the start voltage Vstart to the second voltage level of the end voltage Vend. The first and second time periods 223 and 224 (and, thus, also the first and second continuous output ramp periods 221 and 222 and the first and second continuous output voltage ramps 225 and 226) alternate with each other. The first time periods 223 correspond to the first half of the clock periods of the clock Clkp2 (and the clock Clkn2), and the second time periods 224 correspond to the second half of the clock periods of the clock Clkp2 (and the clock Clkn2).

The first continuous output ramp periods 221 and the first continuous output voltage ramps 225 correspond to the first continuous ramp portion 202 (of the first preliminary ramp periods 201), the first preliminary voltage ramps 204, or the first initial portion 207 of the first preliminary voltage ramps 204. The second continuous output ramp periods 222 and the first continuous output voltage ramps 226 correspond to the second continuous ramp portion 212 (of the second preliminary ramp periods 211), the second preliminary voltage ramps 214, or the second initial portion 217 of the second preliminary voltage ramps 214.

Each of the first and second continuous output voltage ramps 225 and 226 continuously ramps from the start voltage Vstart (i.e., the first voltage level 205) to the end voltage Vend within the first and second continuous output ramp periods 221 and 222 (or the first and second time periods 223 and 224). The first continuous ramp periods 221 are produced from the first preliminary ramp periods 201 of the first preliminary voltage ramp signal Vc1a during the first time periods 223, although the first preliminary voltage ramps 204 continuously ramp not only during but also beyond (e.g., after, as shown) the first time periods 223. The second continuous ramp periods 222 are produced from the second preliminary ramp periods 211 of the second preliminary voltage ramp signal Vc2a during the second time periods 224, although the second preliminary voltage ramps 214 continuously ramp not only during but also beyond (e.g., after, as shown) the second time periods 224. Thus, each of the first continuous voltage ramps 225 is produced from the first initial linear portion 207 of the corresponding first preliminary voltage ramp 204, and each of the second continuous voltage ramps 226 is produced from the second initial linear portion 217 of the corresponding second preliminary voltage ramp 214.

In some embodiments, the set of the switches 105-108 enable the generation of the first preliminary voltage ramps 204 at least during the first time periods 223, electrically connect the first capacitor node C1A to the output node 114 to produce the first continuous output voltage ramps 225 during the first time periods 223, enable the generation of the second preliminary voltage ramps 214 at least during the second time periods 224, and electrically connect the second capacitor node C2A to the output node 114 to produce the second continuous output voltage ramps 226 during the second time periods 224.

At a time t1, corresponding to the beginning of one of the first time periods 223 and the end of a previous second time period 224, a falling edge of the clock Clkn1 occurs along with a rising edge of the clock Clkp2 and a falling edge of the clock Clkn2, since these clocks are synchronized to these edges. Additionally, in some embodiments, the clock Clkp1 is still low at the time t1 (as illustrated); but in other embodiments, the clock Clkp1 rises at this time.

The rise of the clock Clkp2 and the fall of the clock Clkn2 at the time t1 are triggered by the comparator 110. When the output voltage ramp signal VrampA reaches or passes the end voltage Vend, the comparator 110 outputs a voltage pulse. The voltage pulse triggers the clock input CLK of the D flip-flop 109. Since the input D is connected to the inverted output $\overline{Q}$, the triggering of the clock input CLK causes the output Q and the inverted output $\overline{Q}$ to reverse their high/low states, thereby resulting in rising and falling edges of the clock Clkp2 and the clock Clkn2 whenever the output voltage ramp signal VrampA reaches or passes the end voltage Vend, or within an acceptable delay thereafter. Additionally, the reset of the output voltage ramp signal VrampA causes the comparator 110 to end the voltage pulse.

The fall of the clock Clkn1 causes the first reset switch 105 to open, so that the first capacitor node C1A of the first capacitor 103 is not electrically connected to the reset voltage node 113 and the start voltage Vstart, thereby causing or allowing the current from the first current source 101 to be applied to periodically charge the first capacitor 103 and, thus, to start the continuous ramping of the first preliminary voltage ramp 204. The first preliminary voltage ramp 204 starts ramping from the start voltage Vstart (i.e., the first voltage level 205), because immediately prior to the time t1, the clock Clkn1 was high, which held the first reset switch 105 closed, so that the first capacitor node C1A was electrically connected to the reset voltage node 113 and the start voltage Vstart, thereby sinking the current from the first current source 101 through the first reset switch 105 to the source of the start voltage Vstart, and thereby preventing the current from being applied to charge the first capacitor 103 and preventing the first preliminary voltage ramp 204 from ramping. Therefore, the first reset switch 105 is closed during at least a portion of each of the second time periods 224 and is open during at least the first time periods 223.

Additionally, at the time t1, the rise of the clock Clkp2 causes the first output switch 107 to close, so that the first capacitor node C1A is periodically electrically connected to the output node 114 during the first time periods 223, thereby causing the first preliminary voltage ramp 204 to be used to generate the first continuous voltage ramp 225 of the output voltage ramp signal VrampA. In other words, the closing of the first output switch 107 triggers the end of the previous second continuous voltage ramp 226 (at the end voltage Vend) of the output voltage ramp signal VrampA and a very quick reset of the output voltage ramp signal VrampA to the start voltage Vstart for the start of the first continuous voltage ramp 225. (The first output switch 107 is closed during the first time periods 223 and open during the second time periods 224.)

Furthermore, in some embodiments, since the clock Clkp1 is low, the second reset switch 106 is still open at the time t1, so that the previous second preliminary voltage ramp 214 continues to linearly ramp (at the second final portion 218) passed the end voltage Vend to the second voltage level 206 due to the continued application of the current from the second current source 102 to the second capacitor 104. However, the fall of the clock Clkn2 causes the second output switch 108 to open, so that the second capacitor node C2A is not electrically connected to the output node 114, thereby ensuring that the continuation of the second preliminary voltage ramp 214 does not interfere with the generation of the first continuous voltage ramp 225.

At a time point after the time t1 (that depends on the duty cycle of the clock Clkp1), a rising edge of the clock Clkp1 occurs, so that the second reset switch 106 is closed, and so that the second capacitor node C2A is electrically connected to the reset voltage node 113 and the start voltage Vstart, thereby causing the second capacitor 104 to be periodically discharged, and the second preliminary voltage ramp 214 at the second capacitor node C2A to be reset to the start voltage Vstart, i.e., a reset voltage. Since the first continuous voltage ramp 225 is being produced from the first preliminary voltage ramp 204 at this time, however, any noise or curvature due to the time it takes to discharge the second capacitor 104 that might occur in the second preliminary voltage ramp 214 does not affect the first continuous voltage ramp 225. Instead, the quick reset for the start of the first continuous voltage ramp 225 occurred with a minimum of noise at the time t1, since the second preliminary voltage ramp 214 was still linearly ramping into the second final portion 218. In other embodiments, if the rising edge of the clock Clkp1 occurs at the time t1 or the second reset switch 106 is triggered by the clock Clkp2 instead, then the discharge of the second capacitor 104 would occur immediately after the quick reset for the start of the first continuous voltage ramp 225. Thus, although the end of the previous second continuous voltage ramp 226 would occur very close to the beginning of the first continuous voltage ramp 225, most or all of the noise would be cut off by the switch of the first continuous voltage ramp 225 from the second preliminary voltage ramp 214 to the first preliminary voltage ramp 204.

At a time t2, corresponding to the end of the first time period 223 and the beginning of the second time period 224, a falling edge of the clock Clkp1 occurs along with a falling edge of the clock Clkp2 and a rising edge of the clock Clkn2, since these clocks are synchronized to these edges. Additionally, in some embodiments, the clock Clkn1 is still low at the time t2 (as illustrated); but in other embodiments, the clock Clkn1 rises at this time. As above, the fall of the clock Clkp2 and the rise of the clock Clkn2 at the time t2 are triggered by the comparator 110 when the output voltage ramp signal VrampA reaches or passes the end voltage Vend.

The fall of the clock Clkp1 causes the second reset switch 106 to open, so that the second capacitor node C2A of the second capacitor 104 is not electrically connected to the reset voltage node 113 and the start voltage Vstart, thereby causing or allowing the current from the second current source 102 to be applied to periodically charge the second capacitor 104 and, thus, to start the continuous ramping of the second preliminary voltage ramp 214. The second preliminary voltage ramp 214 starts ramping from the start voltage Vstart (i.e., the first voltage level 205), because immediately prior to the time t2, the clock Clkp1 was high, which held the second reset switch 106 closed, so that the second capacitor node C2A was electrically connected to the reset voltage node 113 and the start voltage Vstart, thereby sinking the current from the second current source 102 through the second reset switch 106 to the source of the start voltage Vstart, and thereby preventing the current from being applied to charge the second capacitor 104 and preventing the second preliminary voltage ramp 214 from ramping. Therefore, the second reset switch 106 is closed during at least a portion of each of the first time periods 223 and is open during at least the second time periods 224.

Additionally, at the time t2, the rise of the clock Clkn2 causes the second output switch 108 to close, so that the second capacitor node C2A is electrically connected to the output node 114, thereby causing the second preliminary voltage ramp 214 to be used to generate the second continuous voltage ramp 226 of the output voltage ramp signal VrampA. In other words, the closing of the second output switch 108 triggers the end of the previous first continuous voltage ramp 225 (at the end voltage Vend) of the output voltage ramp signal VrampA and a very quick reset of the output voltage ramp signal VrampA to the start voltage Vstart for the start of the second continuous voltage ramp 226. (The second output switch 108 is open during the first time periods 223 and closed during the second time periods 224.)

Furthermore, in some embodiments, since the clock Clkn1 is low, the first reset switch 105 is still open at the time t2, so that the previous first preliminary voltage ramp 204 continues to linearly ramp (at the first final portion 208) passed the end voltage Vend to the second voltage level 206 due to the continued application of the current from the first current source 101 to the first capacitor 103. However, the fall of the clock Clkp2 causes the first output switch 107 to open, so that the first capacitor node C1A is not electrically connected to the output node 114, thereby ensuring that the continuation of the first preliminary voltage ramp 204 does not interfere with the generation of the second continuous voltage ramp 226.

At a time point after the time t2 (that depends on the duty cycle of the clock Clkn1), a rising edge of the clock Clkn1 occurs, so that the first reset switch 105 is closed, and so that the first capacitor node C1A is electrically connected to the reset voltage node 113 and the start voltage Vstart, thereby causing the first capacitor 103 to be periodically discharged, and the first preliminary voltage ramp 204 at the first capacitor node C1A to be reset, to the start voltage Vstart, i.e., the reset voltage. Since the second continuous voltage ramp 226 is being produced from the second preliminary voltage ramp 214 at this time, however, any noise or curvature due to the time it takes to discharge the first capacitor 103 that might occur in the first preliminary voltage ramp 204 does not affect the second continuous voltage ramp 226. Instead, the quick reset for the start of the second continuous voltage ramp 226 occurred with a minimum of noise at the time t2, since the first preliminary voltage ramp 204 was still linearly ramping into the first final portion 208. In other embodiments, if the rising edge of the clock Clkn1 occurs at the time t2 or the first reset switch 105 is triggered by the clock Clkn2 instead, then the discharge of the first capacitor 103 would occur immediately after the quick reset for the start of the second continuous voltage ramp 226, so although the end of the previous first continuous voltage ramp 225 would occur very close to the beginning of the second preliminary voltage ramp 226, most or all of the noise would be cut off by the switch of the second continuous voltage ramp 226 from the first preliminary voltage ramp 204 to the second preliminary voltage ramp 214.

At a time t3, the above process repeats as if at the time t1. In this manner, the ramp generator 100 multiplexes at each edge of the clock Clkp2 (or Clkn2) between the preliminary voltage ramp signals Vc1a and Vc2a to generate the first and second continuous voltage ramps 225 and 226, respectively, of the output voltage ramp signal VrampA. The return or reset of the output voltage ramp signal VrampA at the end of each first and second continuous voltage ramp 225 and 226 occurs very rapidly and results in very little noise.

Additionally, when the first reset switch 105 is closed and the first capacitor node C1A is electrically connected to the reset voltage node 113 and the start voltage Vstart, the first reset switch 105 has to sink the current from the first current source 101 to the source of the start voltage Vstart. Similarly, when the second reset switch 106 is closed and the second capacitor node C2A is electrically connected to the reset voltage node 113 and the start voltage Vstart, the second reset switch 106 has to sink the current from the second current source 102 to the source of the start voltage Vstart. Therefore, the first and second reset switches 105 and 106 have to be large enough to handle the level of this current. In some embodiments, however, it is advantageous that the voltage level at the first and second capacitor nodes C1A and C2A has to be pulled down only to a positive voltage of the start voltage Vstart, instead of having to be pulled all the way down to zero, which would potentially result in additional noise and power consumption. As a result of the use of the positive start voltage Vstart, the first and second reset switches 105 and 106 do not have to be as large as they would have to be if they had to sink the current to pull the voltage level all the way to ground, and they do not generate as much noise. Additionally, any noise that might be injected by the voltage pulldown to the start voltage Vstart has the entire non-ramp portion 203 or 213 to recover, so the reset of the first and second preliminary voltage ramps 204 and 214 can be done relatively slowly.

An additional benefit of having the positive voltage level for the start voltage Vstart is due to the downstream electronic component (e.g., an amplifier or the downstream comparator 111). The power supply for the downstream electronic component will likely be from ground (zero) to a maximum value. Many comparators, however, cannot reliably handle a lower voltage below a minimum value, such as about 500 millivolts, so the start voltage Vstart prevents the voltage level from dropping too low. For a similar reason, the end voltage Vend should not be above the maximum value of the power supply. The start voltage Vstart (e.g., about one volt) and the end voltage Vend (e.g., about two volts), therefore, place the output voltage ramp signal VrampA within the operating range (e.g., about zero to three volts) of the downstream electronic component.

Additionally, the first and second output switches 107 and 108 do not experience a very high current flow, since the downstream electronic component (e.g., an amplifier or the downstream comparator 111) typically does not pull much current. Therefore, the first and second output switches 107 and 108 can be relatively small, so that they inject very little noise into the output voltage ramp signal VrampA.

The example embodiment of FIGS. 1 and 2 assumes that all of the voltage ramps are positive and that the voltage ramps start at a lower fixed voltage level. In other embodiments, however, the circuit can be inverted, with the current sources at the bottom and negative voltage ramps that start at an upper fixed voltage level. For such embodiments, FIGS. 1 and 2 represent an inverted schematic and inverted timing diagrams.

Figure 3:
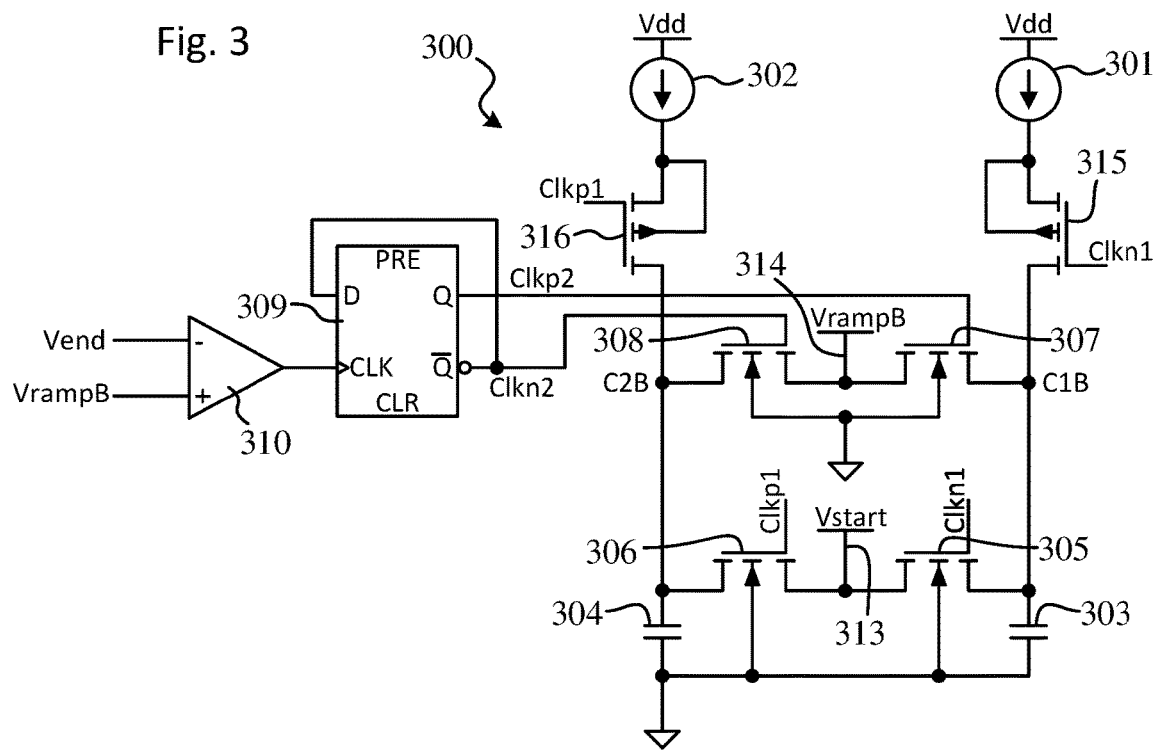
FIG. 3 is a simplified schematic diagram of an example improved ramp generator, in accordance with some embodiments.

An example improved ramp generator 300 is shown in FIG. 3, in accordance with some embodiments. The ramp generator 300 generally includes first and second current sources 301 and 302, first and second capacitors 303 and 304, first and second reset switches 305 and 306, first and second output switches 307 and 308, a D flip-flop 309, a comparator 310, and first and second ramp generator switches 315 and 316, among other components not shown for simplicity. The ramp generator 300 generates an output voltage ramp signal VrampB, which ramps from a first (or start, initial, lower, minimum, or bottom) voltage level to a second (or end, final, upper, maximum, or top) voltage level. The output voltage ramp signal VrampB is typically provided to any appropriate downstream electronic component, e.g., an amplifier or the downstream comparator 111 (FIG. 1) that compares the output voltage ramp signal VrampB with a reference voltage Vref to generate a voltage pulse signal 112 (FIG. 1). For an application or circuit design that uses a relatively short duration voltage pulse (e.g., a few nanoseconds long) and/or that requires high precision in the rising and falling edges of the voltage pulse, the precision and linearity of the voltage ramp signal is of great importance in order to ensure that the comparator 111 is triggered at the precise required timing points. The output voltage ramp signal VrampB is a very precise and linear voltage ramp signal that can be used in such applications.

The first current source 301 is connected between a voltage supply Vdd and the first ramp generator switch 315. The first ramp generator switch 315 may be a MOSFET (e.g., PMOS) device with source and drain connected between the first current source 301 and a node C1B (e.g., an anode) of the first capacitor 303, body connected to the first current source 301, and gate connected to clock Clkn1. A cathode of the first capacitor 303 is connected to ground. The first reset switch 305 may be a MOSFET (e.g., NMOS) device with source and drain connected between the node C1B and a reset voltage node 313, body connected to ground, and gate connected to clock Clkn1. The first output switch 307 may be a MOSFET (e.g., NMOS) device with source and drain connected between the node C1B and an output node 314, body connected to ground, and gate connected to clock Clkp2.

The second current source 302 is connected between the voltage supply Vdd and the second ramp generator switch 316. The second ramp generator switch 316 may be a MOSFET (e.g., PMOS) device with source and drain connected between the second current source 302 and a node C2B (e.g., an anode) of the second capacitor 304, body connected to the second current source 302, and gate connected to clock Clkp1. A cathode of the second capacitor 304 is connected to ground. The second reset switch 306 may be a MOSFET (e.g., NMOS) device with source and drain connected between the node C2B and the reset voltage node 313, body connected to ground, and gate connected to clock Clkp1. The second output switch 308 may be a MOSFET (e.g., NMOS) device with source and drain connected between the node C2B and the output node 314, body connected to ground, and gate connected to clock Clkn2.

The reset voltage node 313 is connected to receive a start voltage Vstart (having a first voltage level). The comparator 310 is connected to receive an end voltage Vend (having a second voltage level greater than the first voltage level in some embodiments) at a negative input thereof. A voltage level of the start voltage Vstart is approximately the first (or initial, lower, or bottom) voltage level of the output voltage ramp signal VrampB. The start voltage Vstart is a baseline voltage, which can be either a positive voltage, ground, or nonzero voltage. A voltage level of the end voltage Vend is approximately the second (end, final, upper, maximum, or top) voltage level of the output voltage ramp signal VrampB. Delays within some of the components of the ramp generator 300 may cause the second (or final, upper, or top) voltage level of the output voltage ramp signal VrampB not to be exactly the same as, but slightly greater than, the voltage level of the end voltage Vend.

The comparator 310 is also connected to the output node 314 to receive the output voltage ramp signal VrampB at a positive input thereof. An output of the comparator 310 is connected to a clock input CLK of the D flip-flop 309. An input D of the D flip-flop 309 is connected to an inverted output $\overline{Q}$ of the D flip-flop 309. An output Q of the D flip-flop 309 produces the clock Clkp2, and the inverted output $\overline{Q}$ produces the clock Clkn2. Thus, the clocks Clkp2 and Clkn2 are inversions of each other. In some embodiments, the clocks Clkp1 and Clkn1 can be the same as, and connected directly to, the clocks Clkp2 and Clkn2. However, in the illustrated embodiment, the clocks Clkp1 and Clkn1 are separate from each other, separate from the clocks Clkp2 and Clkn2, synchronized to the clocks Clkp2 and Clkn2, respectively, and have a duty cycle of 50% or less, as illustrated in FIG. 4.

The first initial or preliminary voltage ramp signal for the ramp generator 300 is produced at the node C1B (i.e., a first capacitor node or a first preliminary ramp node). The second initial or preliminary voltage ramp signal for the ramp generator 300 is produced at the node C2B (i.e., a second capacitor node or a second preliminary ramp node). The output voltage ramp signal VrampB is produced at the output node 314. Generation of the first and second preliminary voltage ramp signals and the output voltage ramp signal VrampB are described with reference to FIGS. 3 and 4.

Figure 4:
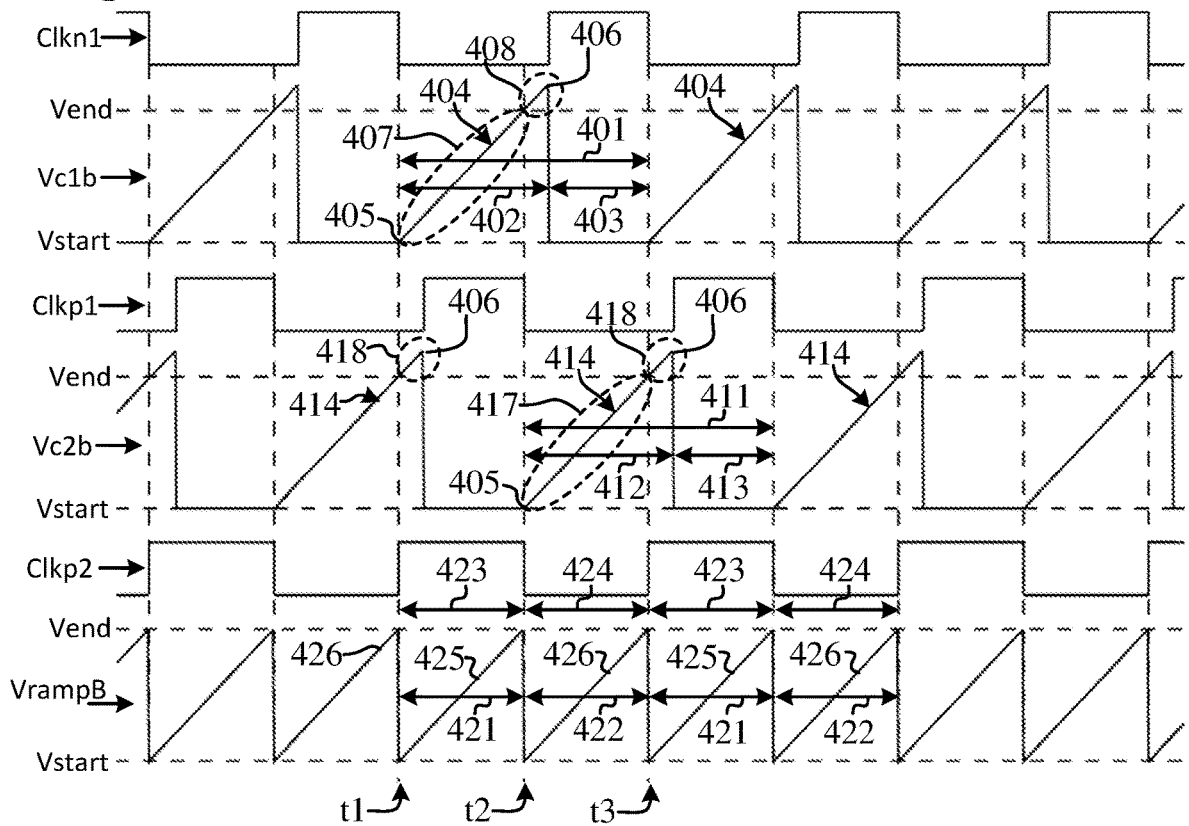
FIG. 4 shows example timing diagrams for operation of the example ramp generator shown in FIG. 3, in accordance with some embodiments.

FIG. 4 shows example timing diagrams for the output voltage ramp signal VrampB, the first preliminary voltage ramp signal (Vc1*b*), the second preliminary voltage ramp signal (Vc2*b*), the clock Clkn1, the clock Clkp1, and the clock Clkp2. Additionally, the clock Clkn2 is simply the inversion of the clock Clkp2, so its timing diagram is omitted for simplicity. The timing diagrams were generated by a simulation running at about 300 MHz with the start voltage Vstart at about one volt and the end voltage Vend at about two volts.

As shown in FIG. 4, the first preliminary voltage ramp signal Vc1*b* has preliminary ramp periods (e.g., 401) that include a continuous ramp portion (e.g., 402) and a non-ramp portion (e.g., 403). Each first preliminary voltage ramp (e.g., 404) (of the first preliminary voltage ramp signal Vc1*b*) continuously ramps from a first voltage level 405 to a second voltage level 406 within the continuous ramp portion 402. The voltage level of the first preliminary voltage ramp signal Vc1*b* is held flat (i.e., relatively unchanging) at the first voltage level 405 within the non-ramp portion 403. (It is understood that the first preliminary voltage ramp signal Vc1*b* is shown as an idealized ramp signal having straight lines with no curve when reset or noise at the start or end of the ramps and resets. However, the real-world ramp signal may exhibit such curves and/or noise.) The first voltage level 405 is generally the same as the start voltage Vstart, which is the reset or initial level at which the first preliminary voltage ramps 404 begin. The second voltage level 406 of the first preliminary voltage ramps 404 is shown as being greater or higher than the end voltage Vend (i.e., the second, end, final, upper, maximum, or top voltage level of the output voltage ramp signal VrampB). Thus, the first preliminary voltage ramps 404 have an initial (linear) portion (e.g., 407) (i.e., between the first voltage level 405 and the end voltage Vend) and a final (also potentially linear) portion (e.g., 408) (i.e., between the end voltage Vend and the second voltage level 406). In other words, the first preliminary voltage ramps 404 continuously ramp from the voltage level of the start voltage Vstart to a voltage level greater than the end voltage Vend in some embodiments.

Similar to the first preliminary voltage ramp signal Vc1b, the second preliminary voltage ramp signal Vc2b (180 degrees out of phase with the first preliminary voltage ramp signal Vc1b) has preliminary ramp periods (e.g., 411) that include a continuous ramp portion (e.g., 412) and a non-ramp portion (e.g., 413). Each second preliminary voltage ramp (e.g., 414) (of the second preliminary voltage ramp signal Vc2b) continuously ramps from the first voltage level 405 to the second voltage level 406 within the continuous ramp portion 412. The voltage level of the second preliminary voltage ramp signal Vc2b is held flat (i.e., relatively unchanging) at the first voltage level 405 within the non-ramp portion 413. (It is understood that the second preliminary voltage ramp signal Vc2b is shown as an idealized ramp signal having straight lines with no curve when reset or noise at the start or end of the ramps and resets. However, the real-world ramp signal may exhibit such curves and/or noise.) The first voltage level 405 is, thus, also the reset or initial level at which the second preliminary voltage ramps 414 begin. The second voltage level 406 of the second preliminary voltage ramps 414 is shown as being greater or higher than the end voltage Vend (i.e., the second, end, final, upper, maximum, or top voltage level of the output voltage ramp signal VrampB). Thus, the second preliminary voltage ramps 414 have an initial (linear) portion (e.g., 417) (i.e., between the first voltage level 405 and the end voltage Vend) and a final (also potentially linear) portion (e.g., 418) (i.e., between the end voltage Vend and the second voltage level 406). In other words, like the first preliminary voltage ramps 404, the second preliminary voltage ramps 414 continuously ramp from the voltage level of the start voltage Vstart to a voltage level greater than the end voltage Vend in some embodiments. (The ends of the first and second preliminary voltage ramps 404 and 414 overscan the end voltage Vend.)

The second preliminary ramp periods 411 are about the same as the first preliminary ramp periods 401, the second continuous ramp portion 412 is about the same as the first continuous ramp portion 402, the second non-ramp portion 413 is about the same as the first non-ramp portion 403, the second preliminary voltage ramps 414 are about the same as the first preliminary voltage ramps 404, the second initial portion 417 is about the same as the first initial portion 407, and the second final portion 418 is about the same as first the final portion 408.

In the illustrated example, the clock Clkn1 and the clock Clkp1 (which are 180 degrees out of phase with each other) have clock periods that are about the same as the preliminary ramp periods 401 and 411 (which are also 180 degrees out of phase with each other), respectively. Additionally, the duty cycle of the clocks Clkn1 and Clkp1 is shown as being less than 50%. (In other embodiments, the duty cycle of the clocks Clkn1 and Clkp1 can be about equal to 50%, such that the continuous ramp portions 402 and 412 and the non-ramp portions 403 and 413 are about equal to each other, the final portions 408 and 418 are almost nonexistent, and the second voltage level 406 is about the same as the end voltage Vend.) The clock Clkp2 (and, thus, also the clock Clkn2) also has a clock period that is about the same as the preliminary ramp periods 401 and 411, but it is shown with about a 50% duty cycle.

The output voltage ramp signal VrampB has first and second continuous output ramp periods (e.g., 421 and 422) during first and second time periods (e.g., 423 and 424), respectively. The first and second continuous output ramp periods 421 and 422 have first and second continuous output voltage ramps (e.g., 425 and 426), respectively, that continuously ramp from the first voltage level of the start voltage Vstart to the second voltage level of the end voltage Vend. The first and second time periods 423 and 424 (and, thus, also the first and second continuous output ramp periods 421 and 422 and the first and second continuous output voltage ramps 425 and 426) alternate with each other. The first time periods 423 correspond to the first half of the clock periods of the clock Clkp2 (and the clock Clkn2), and the second time periods 424 correspond to the second half of the clock periods of the clock Clkp2 (and the clock Clkn2).

The first continuous output ramp periods 421 and the first continuous output voltage ramps 425 correspond to the first continuous ramp portion 402 (of the first preliminary ramp periods 401), the first preliminary voltage ramps 404, or the first initial portion 407 of the first preliminary voltage ramps 404. The second continuous output ramp periods 422 and the first continuous output voltage ramps 426 correspond to the second continuous ramp portion 412 (of the second preliminary ramp periods 411), the second preliminary voltage ramps 414, or the second initial portion 417 of the second preliminary voltage ramps 414.

Each of the first and second continuous output voltage ramps 425 and 426 continuously ramps from the start voltage Vstart (i.e., the first voltage level 405) to the end voltage Vend within the first and second continuous output ramp periods 421 and 422 (or the first and second time periods 423 and 424). The first continuous ramp periods 421 are produced from the first preliminary ramp periods 401 of the first preliminary voltage ramp signal Vc1b during the first time periods 423, although the first preliminary voltage ramps 404 continuously ramp not only during but also beyond (e.g., after, as shown) the first time periods 423. The second continuous ramp periods 422 are produced from the second preliminary ramp periods 411 of the second preliminary voltage ramp signal Vc2b during the second time periods 424, although the second preliminary voltage ramps 414 continuously ramp not only during but also beyond (e.g., after, as shown) the second time periods 424. Thus, each of the first continuous voltage ramps 425 is produced from the first initial linear portion 407 of the corresponding first preliminary voltage ramp 404, and each of the second continuous voltage ramps 426 is produced from the second initial linear portion 417 of the corresponding second preliminary voltage ramp 414.

In some embodiments, the set of the switches 305-308, 315 and 316 enable the generation of the first preliminary voltage ramps 404 at least during the first time periods 423, electrically connect the first capacitor node C1B to the output node 314 to produce the first continuous output voltage ramps 425 during the first time periods 423, enable the generation of the second preliminary voltage ramps 414 at least during the second time periods 424, and electrically connect the second capacitor node C2B to the output node 314 to produce the second continuous output voltage ramps 426 during the second time periods 424.

At a time t1, the beginning of one of the first time periods 423 and the end of a previous second time period 424, a falling edge of the clock Clkn1 occurs along with a rising edge of the clock Clkp2 and a falling edge of the clock Clkn2, since these clocks are synchronized to these edges. Additionally, in some embodiments, the clock Clkp1 is still low at the time t1 (as illustrated); but in other embodiments, the clock Clkp1 rises at this time.

The rise of the clock Clkp2 and the fall of the clock Clkn2 at the time t1 are triggered by the comparator 310. When the output voltage ramp signal VrampB reaches or passes the end voltage Vend, the comparator 310 outputs a voltage pulse. The voltage pulse triggers the clock input CLK of the D flip-flop 309. Since the input D is connected to the inverted output $\overline{Q}$, the triggering of the clock input CLK causes the output Q and the inverted output $\overline{Q}$ to reverse their high/low states, thereby resulting in rising and falling edges of the clock Clkp2 and the clock Clkn2 whenever the output voltage ramp signal VrampB reaches or passes the end voltage Vend, or within an acceptable delay thereafter. Additionally, the reset of the output voltage ramp signal VrampB causes the comparator 310 to end the voltage pulse.

The fall of the clock Clkn1 causes the first ramp generator switch 315 to close, so that the first current source 301 is electrically connected to the first capacitor node C1B and the first capacitor 303, thereby causing or allowing the current from the first current source 301 to be applied to periodically charge the first capacitor 303 and, thus, to start the continuous ramping of the first preliminary voltage ramp 404. Additionally, the fall of the clock Clkn1 causes the first reset switch 305 to open, so that the first capacitor node C1B of the first capacitor 303 is not electrically connected to the reset voltage node 313 and the start voltage Vstart, thereby not interfering with the current from the first current source 301 being applied to periodically charge the first capacitor 303. The first preliminary voltage ramp 404 starts ramping from the start voltage Vstart (i.e., the first voltage level 405), because immediately prior to the time t1, the clock Clkn1 was high, which held the first reset switch 305 closed, so that the first capacitor node C1B was electrically connected to the reset voltage node 313 and the start voltage Vstart. Additionally, since the clock Clkn1 was high immediately prior to the time t1, the first ramp generator switch 315 was open, so that the first capacitor node C1B was not electrically connected to the first current source 301. Thus, the first reset switch 305 does not need to sink the current from the first current source 301 to the source of the start voltage Vstart in order to reset the first preliminary voltage ramp signal Vc1b, as described above for the first current source 101. Instead, the open first ramp generator switch 315 prevents the current from being applied to charge the first capacitor 303 and prevents the first preliminary voltage ramp 404 from ramping prior to the time t1 or during the second time periods 424, so that the first reset switch 305 can hold the first capacitor node C1B to the start voltage Vstart. Therefore, the first reset switch 305 is closed during at least a portion of each of the second time periods 424 and is open during at least the first time periods 423, and the first ramp generator switch 315 is open during at least a portion of each of the second time periods 424 and is closed during at least the first time periods 423.

Additionally, at the time t1, the rise of the clock Clkp2 causes the first output switch 307 to close, so that the first capacitor node C1B is periodically electrically connected to the output node 314 during the first time periods 423, thereby causing the first preliminary voltage ramp 404 to be used to generate the first continuous voltage ramp 425 of the output voltage ramp signal VrampB. In other words, the closing of the first output switch 307 triggers the end of the previous second continuous voltage ramp 426 (at the end voltage Vend) of the output voltage ramp signal VrampB and a very quick reset of the output voltage ramp signal VrampB to the start voltage Vstart for the start of the first continuous voltage ramp 425. (The first output switch 307 is closed during the first time periods 423 and open during the second time periods 424.)

Furthermore, in some embodiments, since the clock Clkp1 is low, the second reset switch 306 is still open and the second ramp generator switch 316 is still closed at the time t1, so that the previous second preliminary voltage ramp 414 continues to linearly ramp (at the second final portion 418) passed the end voltage Vend to the second voltage level 406 due to the continued application of the current from the second current source 302 to the second capacitor 304. However, the fall of the clock Clkn2 causes the second output switch 308 to open, so that the second capacitor node C2B is not electrically connected to the output node 314, thereby ensuring that the continuation of the second preliminary voltage ramp 414 does not interfere with the generation of the first continuous voltage ramp 425.

At a time point after the time t1 (that depends on the duty cycle of the clock Clkp1), a rising edge of the clock Clkp1 occurs, so that the second reset switch 306 is closed and the second ramp generator switch 316 is open, and so that the second capacitor node C2B is electrically connected to the reset voltage node 313 and the start voltage Vstart but not to the second current source 302, thereby causing the second capacitor 304 to be periodically discharged, and the second preliminary voltage ramp 414 at the second capacitor node C2B to be reset, to the start voltage Vstart, i.e., a reset voltage. Since the first continuous voltage ramp 425 is being produced from the first preliminary voltage ramp 404 at this time, however, any noise or curvature due to the time it takes to discharge the second capacitor 304 that might occur in the second preliminary voltage ramp 414 does not affect the first continuous voltage ramp 425. Instead, the quick reset for the start of the first continuous voltage ramp 425 occurred with a minimum of noise at the time t1, since the second preliminary voltage ramp 414 was still linearly ramping into the second final portion 418. In other embodiments, if the rising edge of the clock Clkp1 occurs at the time t1 or the second reset switch 306 and the second ramp generator switch 316 are triggered by the clock Clkp2 instead, then the discharge of the second capacitor 304 would occur immediately after the quick reset for the start of the first continuous voltage ramp 425, so although the end of the previous second continuous voltage ramp 426 would occur very close to the beginning of the first continuous voltage ramp 425, most or all of the noise would be cut off by the switch of the first continuous voltage ramp 425 from the second preliminary voltage ramp 414 to the first preliminary voltage ramp 404.

At a time t2, the end of the first time period 423 and the beginning of the second time period 424, a falling edge of the clock Clkp1 occurs along with a falling edge of the clock Clkp2 and a rising edge of the clock Clkn2, since these clocks are synchronized to these edges. Additionally, in some embodiments, the clock Clkn1 is still low at the time t2 (as illustrated); but in other embodiments, the clock Clkn1 rises at this time. As above, the fall of the clock Clkp2 and the rise of the clock Clkn2 at the time t2 are triggered by the comparator 310 when the output voltage ramp signal VrampB reaches or passes the end voltage Vend.

The fall of the clock Clkp1 causes the second ramp generator switch 316 to close, so that the second current source 302 is electrically connected to the second capacitor node C2B and the second capacitor 304, thereby causing or allowing the current from the second current source 302 to be applied to periodically charge the second capacitor 304 and, thus, to start the continuous ramping of the second preliminary voltage ramp 414. Additionally, the fall of the clock Clkp1 causes the second reset switch 306 to open, so that the second capacitor node C2B of the second capacitor 304 is not electrically connected to the reset voltage node 313 and the start voltage Vstart, thereby not interfering with the current from the second current source 302 being applied to periodically charge the second capacitor 304. The second preliminary voltage ramp 414 starts ramping from the start voltage Vstart (i.e., the first voltage level 405), because immediately prior to the time t2, the clock Clkp1 was high, which held the second reset switch 306 closed, so that the second capacitor node C2B was electrically connected to the reset voltage node 313 and the start voltage Vstart. Additionally, since the clock Clkp1 was high immediately prior to the time t2, the second ramp generator switch 316 was open, so that the second capacitor node C2B was not electrically connected to the second current source 302. Thus, the second reset switch 306 does not need to sink the current from the second current source 302 to the source of the start voltage Vstart in order to reset the second preliminary voltage ramp signal Vc2b, as described above for the first current source 101. Instead, the open second ramp generator switch 316 prevents the current from being applied to charge the second capacitor 304 and prevents the second preliminary voltage ramp 414 from ramping prior to the time t2 or during the first time periods 423, so that the second reset switch 306 can hold the second capacitor node C2B to the start voltage Vstart. Therefore, the second reset switch 306 is closed during at least a portion of each of the first time periods 423 and is open during at least the second time periods 424, and the second ramp generator switch 316 is open during at least a portion of each of the first time periods 423 and is closed during at least the second time periods 424.

Additionally, at the time t2, the rise of the clock Clkn2 causes the second output switch 308 to close, so that the second capacitor node C2B is electrically connected to the output node 314, thereby causing the second preliminary voltage ramp 414 to be used to generate the second continuous voltage ramp 426 of the output voltage ramp signal VrampB. In other words, the closing of the second output switch 308 triggers the end of the previous first continuous voltage ramp 425 (at the end voltage Vend) of the output voltage ramp signal VrampB and a very quick reset of the output voltage ramp signal VrampB to the start voltage Vstart for the start of the second continuous voltage ramp 426. (The second output switch 308 is open during the first time periods 423 and closed during the second time periods 424.)

Furthermore, in some embodiments, since the clock Clkn1 is low, the first reset switch 305 is still open and the first ramp generator switch 315 is still closed at the time t2, so that the previous first preliminary voltage ramp 404 continues to linearly ramp (at the first final portion 408) passed the end voltage Vend to the second voltage level 406 due to the continued application of the current from the first current source 301 to the first capacitor 303. However, the fall of the clock Clkp2 causes the first output switch 307 to open, so that the first capacitor node C1B is not electrically connected to the output node 314, thereby ensuring that the continuation of the first preliminary voltage ramp 404 does not interfere with the generation of the second continuous voltage ramp 426.

At a time point after the time t2 (that depends on the duty cycle of the clock Clkn1), a rising edge of the clock Clkn1 occurs, so that the first reset switch 305 is closed and the first ramp generator switch 315 is open, and so that the first capacitor node C1B is electrically connected to the reset voltage node 313 and the start voltage Vstart but not to the first current source 301, thereby causing the first capacitor 303 to be periodically discharged, and the first preliminary voltage ramp 404 at the first capacitor node C1B to be reset, to the start voltage Vstart, i.e., the reset voltage. Since the second continuous voltage ramp 426 is being produced from the second preliminary voltage ramp 414 at this time, however, any noise or curvature due to the time it takes to discharge the first capacitor 303 that might occur in the first preliminary voltage ramp 404 does not affect the second continuous voltage ramp 426. Instead, the quick reset for the start of the second continuous voltage ramp 426 occurred with a minimum of noise at the time t2, since the first preliminary voltage ramp 404 was still linearly ramping into the first final portion 408. In other embodiments, if the rising edge of the clock Clkn1 occurs at the time t2 or the first reset switch 305 and the second ramp generator switch 316 are triggered by the clock Clkn2 instead, then the discharge of the first capacitor 303 would occur immediately after the quick reset for the start of the second continuous voltage ramp 426, so although the end of the previous first continuous voltage ramp 425 would occur very close to the beginning of the second preliminary voltage ramp 426, most or all of the noise would be cut off by the switch of the second continuous voltage ramp 426 from the first preliminary voltage ramp 404 to the second preliminary voltage ramp 414.

At a time t3, the above process repeats as if at the time t1. In this manner, the ramp generator 300 multiplexes at each edge of the clock Clkp2 (or Clkn2) between the preliminary voltage ramp signals Vc1b and Vc2b to generate the first and second continuous voltage ramps 425 and 426, respectively, of the output voltage ramp signal VrampB. The return or reset of the output voltage ramp signal VrampB at the end of each first and second continuous voltage ramp 425 and 426 occurs very rapidly and results in very little noise.

Additionally, since the open first and second ramp generator switches 315 and 316 eliminate any need for the closed first and second reset switch 305 and 306, respectively, to sink the current from the first and second current sources 301 and 302 to the source of the start voltage Vstart, the first and second reset switches 305 and 306 do not have to be large enough to handle the level of this current. Instead, the first and second reset switches 305 and 306 can be relatively small, as needed for a relatively small current. Additionally, in some embodiments, it is advantageous that the voltage level at the first and second capacitor nodes C1B and C2B has to be pulled down only to a positive voltage of the start voltage Vstart, instead of having to be pulled all the way down to zero, which would potentially result in additional noise and power consumption. Additionally, any noise that might be injected by the voltage pulldown to the start voltage Vstart has the entire non-ramp portion 403 or 413 to recover, so the reset of the first and second preliminary voltage ramps 404 and 414 can be done relatively slowly.

An additional benefit of having the positive voltage level for the start voltage Vstart is due to the downstream electronic component (e.g., an amplifier or the downstream comparator 111). The power supply for the downstream electronic component will likely be from ground (zero) to a maximum value. Many comparators, however, cannot reliably handle a lower voltage below a minimum value, such as about 500 millivolts, so the start voltage Vstart prevents the voltage level from dropping too low. For a similar reason, the end voltage Vend should not be above the maximum value of the power supply. The start voltage Vstart (e.g., about one volt) and the end voltage Vend (e.g., about two volts), therefore, place the output voltage ramp signal VrampB within the operating range (e.g., about zero to three volts) of the downstream electronic component.

Additionally, the first and second output switches 307 and 308 do not experience a very high current flow, since the downstream electronic component (e.g., an amplifier or the downstream comparator 111) typically does not pull much current. Therefore, the first and second output switches 307 and 308 can be relatively small, so that they inject very little noise into the output voltage ramp signal VrampB.

The example embodiment of FIGS. 3 and 4 assumes that all of the voltage ramps are positive and that the voltage ramps start at a lower fixed voltage level. In other embodiments, however, the circuit can be inverted, with the current sources at the bottom and negative voltage ramps that start at an upper fixed voltage level. For such embodiments, FIGS. 3 and 4 represent an inverted schematic and inverted timing diagrams.

Figure 5:
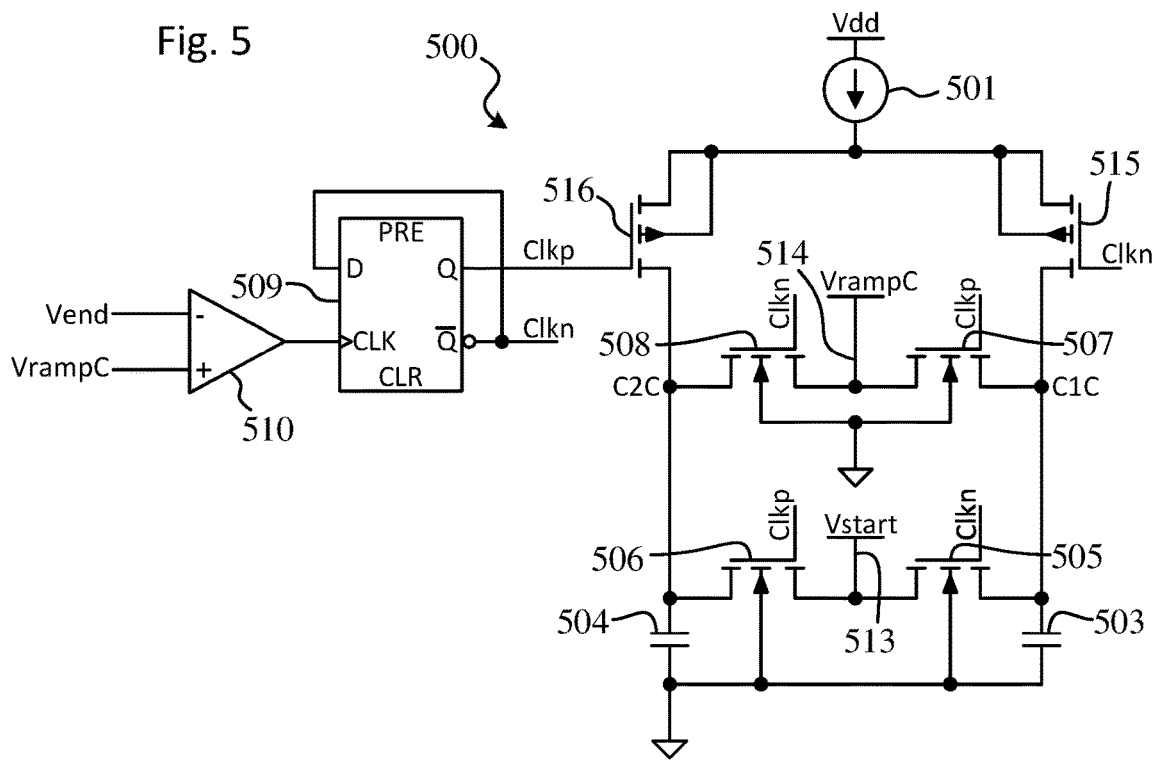
FIG. 5 is a simplified schematic diagram of an example improved ramp generator, in accordance with some embodiments.

An example improved ramp generator 500 is shown in FIG. 5, in accordance with some embodiments. The ramp generator 500 generally includes a current source 501, first and second capacitors 503 and 504, first and second reset switches 505 and 506, first and second output switches 507 and 508, a D flip-flop 509, a comparator 510, and first and second ramp generator switches 515 and 516, among other components not shown for simplicity. The ramp generator 500 generates an output voltage ramp signal VrampC, which ramps from a first (or start, initial, lower, minimum, or bottom) voltage level to a second (or end, final, upper, maximum, or top) voltage level. The output voltage ramp signal VrampC is typically provided to any appropriate downstream electronic component, e.g., an amplifier or the downstream comparator 111 (FIG. 1) that compares the output voltage ramp signal VrampC with a reference voltage Vref to generate a voltage pulse signal 112 (FIG. 1). For an application or circuit design that uses a relatively short duration voltage pulse (e.g., a few nanoseconds long) and/or that requires high precision in the rising and falling edges of the voltage pulse, the precision and linearity of the voltage ramp signal is of great importance in order to ensure that the comparator 111 is triggered at the precise required timing points. The output voltage ramp signal VrampC is a very precise and linear voltage ramp signal that can be used in such applications.

The current source 501 is connected between a voltage supply Vdd and the first ramp generator switch 515. The first ramp generator switch 515 may be a MOSFET (e.g., PMOS) device with source and drain connected between the current source 501 and a node C1C (e.g., an anode) of the first capacitor 503, body connected to the current source 501, and gate connected to clock Clkn. A cathode of the first capacitor 503 is connected to ground. The first reset switch 505 may be a MOSFET (e.g., NMOS) device with source and drain connected between the node C1C and a reset voltage node 513, body connected to ground, and gate connected to clock Clkn. The first output switch 507 may be a MOSFET (e.g., NMOS) device with source and drain connected between the node C1C and an output node 514, body connected to ground, and gate connected to clock Clkp.

The current source 501 is also connected between the voltage supply Vdd and the second ramp generator switch 516. The second ramp generator switch 516 may be a MOSFET (e.g., PMOS) device with source and drain connected between the current source 501 and a node C2C (e.g., an anode) of the second capacitor 504, body connected to the current source 501, and gate connected to clock Clkp. A cathode of the second capacitor 504 is connected to ground. The second reset switch 506 may be a MOSFET (e.g., NMOS) device with source and drain connected between the node C2C and the reset voltage node 513, body connected to ground, and gate connected to clock Clkp1. The second output switch 508 may be a MOSFET (e.g., NMOS) device with source and drain connected between the node C2C and the output node 514, body connected to ground, and gate connected to clock Clkn2.

The reset voltage node 513 is connected to receive a start voltage Vstart (having a first voltage level). The comparator 510 is connected to receive an end voltage Vend (having a second voltage level greater than the first voltage level in some embodiments) at a negative input thereof. A voltage level of the start voltage Vstart is approximately the first (or initial, lower, or bottom) voltage level of the output voltage ramp signal VrampC. The start voltage Vstart is a baseline voltage, which can be either a positive voltage, ground, or nonzero voltage. A voltage level of the end voltage Vend is approximately the second (end, final, upper, maximum, or top) voltage level of the output voltage ramp signal VrampC. Delays within some of the components of the ramp generator 500 may cause the second (or final, upper, or top) voltage level of the output voltage ramp signal VrampC not to be exactly the same as, but slightly greater than, the voltage level of the end voltage Vend.

The comparator 510 is also connected to the output node 514 to receive the output voltage ramp signal VrampC at a positive input thereof. An output of the comparator 510 is connected to a clock input CLK of the D flip-flop 509. An input D of the D flip-flop 509 is connected to an inverted output $\overline{Q}$ of the D flip-flop 509. An output Q of the D flip-flop 509 produces the clock Clkp, and the inverted output $\overline{Q}$ produces the clock Clkn. Thus, the clocks Clkp and Clkn are inversions of each other.

The first initial or preliminary voltage ramp signal for the ramp generator 500 is produced at the node C1C (i.e., a first capacitor node or a first preliminary ramp node). The second initial or preliminary voltage ramp signal for the ramp generator 500 is produced at the node C2C (i.e., a second capacitor node or a second preliminary ramp node). The output voltage ramp signal VrampC is produced at the output node 514. Generation of the first and second preliminary voltage ramp signals and the output voltage ramp signal VrampC are described with reference to FIGS. 5 and 6.

Figure 6:
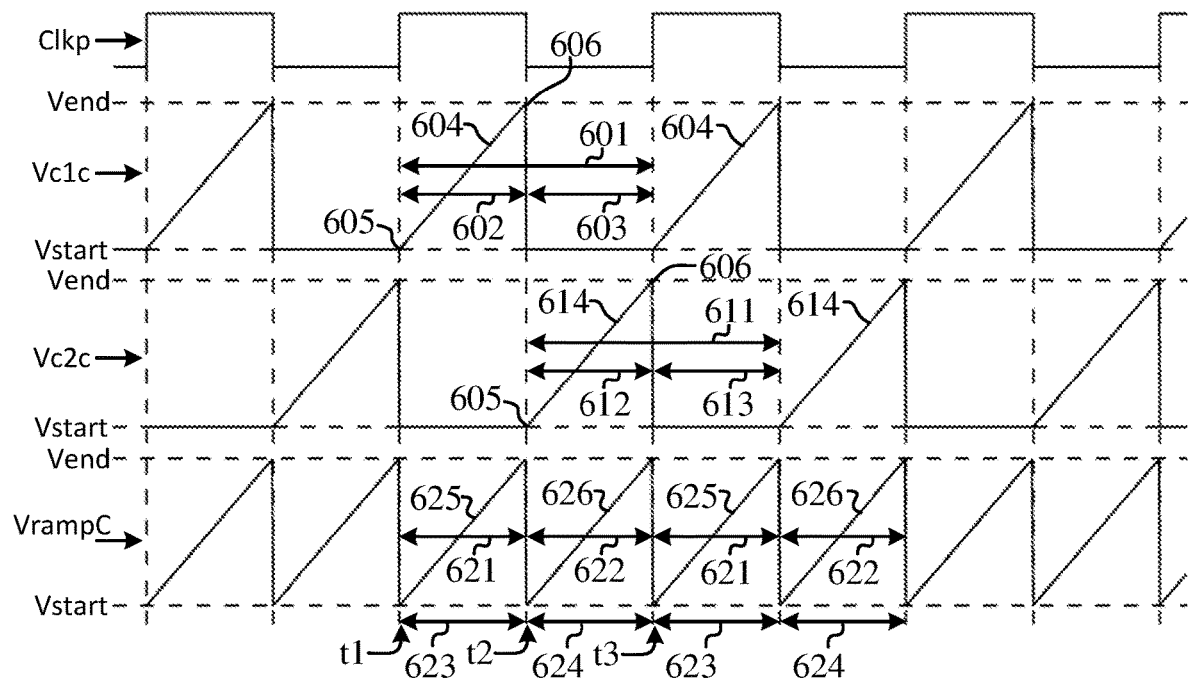
FIG. 6 shows example timing diagrams for operation of the example ramp generator shown in FIG. 5, in accordance with some embodiments.

FIG. 6 shows example timing diagrams for the output voltage ramp signal VrampC, the first preliminary voltage ramp signal (Vc1c), the second preliminary voltage ramp signal (Vc2c), and the clock Clkp. Additionally, the clock Clkn is simply the inversion of the clock Clkp, so its timing diagram is omitted for simplicity. The timing diagrams were generated by a simulation running at about 500 MHz with the start voltage Vstart at about one volt and the end voltage Vend at about two volts.

As shown in FIG. 6, the first preliminary voltage ramp signal Vc1c has preliminary ramp periods (e.g., 601) that include a continuous ramp portion (e.g., 602) and a non-ramp portion (e.g., 603). Each first preliminary voltage ramp (e.g., 604) (of the first preliminary voltage ramp signal Vc1c) continuously ramps from a first voltage level 605 to a second voltage level 606 within the continuous ramp portion 602. The voltage level of the first preliminary voltage ramp signal Vc1c is held flat (i.e., relatively unchanging) at the first voltage level 605 within the non-ramp portion 603. (It is understood that the first preliminary voltage ramp signal Vc1c is shown as an idealized ramp signal having straight lines with no curve when reset or noise at the start or end of the ramps and resets. However, the real-world ramp signal may exhibit such curves and/or noise.) The first voltage level 605 is generally the same as the start voltage Vstart, which is the reset or initial level at which the first preliminary voltage ramps 604 begin. The second voltage level 606 of the first preliminary voltage ramps 604 is generally the same as the end voltage Vend (i.e., the second, end, final, upper, maximum, or top voltage level of the output voltage ramp signal VrampC). Thus, the first preliminary voltage ramps 604 continuously ramp from the voltage level of the start voltage Vstart to the voltage level of the end voltage Vend, without overscanning the end voltage Vend as shown above for embodiments of FIGS. 1-4.

Similar to the first preliminary voltage ramp signal Vc1c, the second preliminary voltage ramp signal Vc2c (180 degrees out of phase with the first preliminary voltage ramp signal Vc1c) has preliminary ramp periods (e.g., 611) that include a continuous ramp portion (e.g., 612) and a non-ramp portion (e.g., 613). Each second preliminary voltage ramp (e.g., 614) (of the second preliminary voltage ramp signal Vc2c) continuously ramps from the first voltage level 605 to the second voltage level 606 within the continuous ramp portion 612. The voltage level of the second preliminary voltage ramp signal Vc2c is held flat (i.e., relatively unchanging) at the first voltage level 605 within the non-ramp portion 613. (It is understood that the second preliminary voltage ramp signal Vc2c is shown as an idealized ramp signal having straight lines with no curve when reset or noise at the start or end of the ramps and resets. However, the real-world ramp signal may exhibit such curves and/or noise.) The first voltage level 605 is, thus, also the reset or initial level at which the second preliminary voltage ramps 614 begin. The second voltage level 606 of the second preliminary voltage ramps 614 is generally the same as the end voltage Vend (i.e., the second, end, final, upper, maximum, or top voltage level of the output voltage ramp signal VrampC). Thus, like the first preliminary voltage ramps 604, the second preliminary voltage ramps 614 continuously ramp from the voltage level of the start voltage Vstart to the voltage level of the end voltage Vend, without overscanning the end voltage Vend as shown above for embodiments of FIGS. 1-4.

The second preliminary ramp periods 611 are about the same as the first preliminary ramp periods 601, the second continuous ramp portion 612 is about the same as the first continuous ramp portion 602, the second non-ramp portion 613 is about the same as the first non-ramp portion 603, and the second preliminary voltage ramps 614 are about the same as the first preliminary voltage ramps 604.

In the illustrated example, the clock Clkn and the clock Clkp (which are 180 degrees out of phase with each other) have clock periods that are about the same as the preliminary ramp periods 601 and 611 (which are also 180 degrees out of phase with each other), respectively. Additionally, the duty cycle of the clocks Clkn and Clkp is shown as being about equal to 50%, such that the continuous ramp portions 602 and 612 and the non-ramp portions 603 and 613 are about equal to each other.

The output voltage ramp signal VrampC has first and second continuous output ramp periods (e.g., 621 and 622) during first and second time periods (e.g., 623 and 624), respectively. The first and second continuous output ramp periods 621 and 622 have first and second continuous output voltage ramps (e.g., 625 and 626), respectively, that continuously ramp from the first voltage level of the start voltage Vstart to the second voltage level of the end voltage Vend. The first and second time periods 623 and 624 (and, thus, also the first and second continuous output ramp periods 621 and 622 and the first and second continuous output voltage ramps 625 and 626) alternate with each other. The first time periods 623 correspond to the first half of the clock periods of the clock Clkp (and the clock Clkn), and the second time periods 624 correspond to the second half of the clock periods of the clock Clkp (and the clock Clkn).

The first continuous output ramp periods 621 and the first continuous output voltage ramps 625 correspond to the first continuous ramp portion 602 (of the first preliminary ramp periods 601), or the first preliminary voltage ramps 604. The second continuous output ramp periods 622 and the first continuous output voltage ramps 626 correspond to the second continuous ramp portion 612 (of the second preliminary ramp periods 611), or the second preliminary voltage ramps 614.

Each of the first and second continuous output voltage ramps 625 and 626 continuously ramps from the start voltage Vstart (i.e., the first voltage level 605) to the end voltage Vend within the first and second continuous output ramp periods 621 and 622 (or the first and second time periods 623 and 624). The first continuous ramp periods 621 are produced from the first preliminary ramp periods 601 of the first preliminary voltage ramp signal Vc1c during the first time periods 623. The second continuous ramp periods 622 are produced from the second preliminary ramp periods 611 of the second preliminary voltage ramp signal Vc2c during the second time periods 624. Thus, each of the first continuous voltage ramps 625 is produced from the corresponding first preliminary voltage ramp 604, and each of the second continuous voltage ramps 626 is produced from the corresponding second preliminary voltage ramp 614.

In some embodiments, the set of the switches 505-508, 515 and 516 enable the generation of the first preliminary voltage ramps 604 at least during the first time periods 623, electrically connect the first capacitor node C1C to the output node 514 to produce the first continuous output voltage ramps 625 during the first time periods 623, enable the generation of the second preliminary voltage ramps 614 at least during the second time periods 624, and electrically connect the second capacitor node C2C to the output node 514 to produce the second continuous output voltage ramps 626 during the second time periods 624.

At a time t1, the beginning of one of the first time periods 623 and the end of a previous second time period 624, a rising edge of the clock Clkp occurs along with a falling edge of the clock Clkn. The rise of the clock Clkp and the fall of the clock Clkn at the time t1 are triggered by the comparator 510. When the output voltage ramp signal VrampC reaches or passes the end voltage Vend, the comparator 510 outputs a voltage pulse. The voltage pulse triggers the clock input CLK of the D flip-flop 509. Since the input D is connected to the inverted output $\overline{Q}$, the triggering of the clock input CLK causes the output Q and the inverted output $\overline{Q}$ to reverse their high/low states, thereby resulting in rising and falling edges of the clock Clkp and the clock Clkn whenever the output voltage ramp signal VrampC reaches or passes the end voltage Vend, or within an acceptable delay thereafter. Additionally, the reset of the output voltage ramp signal VrampC causes the comparator 510 to end the voltage pulse.

The fall of the clock Clkn causes the first ramp generator switch 515 to close, so that the current source 501 is electrically connected to the first capacitor node C1C and the first capacitor 503, thereby causing or allowing the current from the current source 501 to be applied to periodically charge the first capacitor 503 and, thus, to start the continuous ramping of the first preliminary voltage ramp 604. Additionally, the fall of the clock Clkn causes the first reset switch 505 to open, so that the first capacitor node C1C of the first capacitor 503 is not electrically connected to the reset voltage node 513 and the start voltage Vstart, thereby not interfering with the current from the current source 501 being applied to periodically charge the first capacitor 503. The first preliminary voltage ramp 604 starts ramping from the start voltage Vstart (i.e., the first voltage level 605), because immediately prior to the time t1, the clock Clkn was high, which held the first reset switch 505 closed, so that the first capacitor node C1C was electrically connected to the reset voltage node 513 and the start voltage Vstart. Additionally, since the clock Clkn was high immediately prior to the time t1, the first ramp generator switch 515 was open, so that the first capacitor node C1C was not electrically connected to the current source 501. Thus, the first reset switch 505 does not need to sink the current from the current source 501 to the source of the start voltage Vstart in order to reset the first preliminary voltage ramp signal Vc1c, as described above for the first current source 101. Instead, the open first ramp generator switch 515 prevents the current from being applied to charge the first capacitor 503 and prevents the first preliminary voltage ramp 604 from ramping prior to the time t1 or during the second time periods 624, so that the first reset switch 505 can hold the first capacitor node C1C to the start voltage Vstart. Therefore, the first reset switch 505 is closed during at least a portion of each of the second time periods 624 and is open during at least the first time periods 623, and the first ramp generator switch 515 is open during at least a portion of each of the second time periods 624 and is closed during at least the first time periods 623.

Additionally, at the time t1, the rise of the clock Clkp causes the first output switch 507 to close, so that the first capacitor node C1C is periodically electrically connected to the output node 514 during the first time periods 623, thereby causing the first preliminary voltage ramp 604 to be used to generate the first continuous voltage ramp 625 of the output voltage ramp signal VrampC. In other words, the closing of the first output switch 507 triggers the end of the previous second continuous voltage ramp 626 (at the end voltage Vend) of the output voltage ramp signal VrampC and a very quick reset of the output voltage ramp signal VrampC to the start voltage Vstart for the start of the first continuous voltage ramp 625. (The first output switch 507 is closed during the first time periods 623 and open during the second time periods 624.)

Furthermore, at the time t1, the rising edge of the clock Clkp causes the second reset switch 506 to close and the second ramp generator switch 516 to open, so that the second capacitor node C2C is electrically connected to the reset voltage node 513 and the start voltage Vstart but not to the current source 501, thereby causing the second capacitor 504 to be periodically discharged, and the second preliminary voltage ramp 614 at the second capacitor node C2C to be reset, to the start voltage Vstart, i.e., a reset voltage. Since the rising edge of the clock Clkp occurs at the time t1, the discharge of the second capacitor 504 occurs immediately after the quick reset for the start of the first continuous voltage ramp 625, so although the end of the previous second continuous voltage ramp 626 occurs very close to the beginning of the first continuous voltage ramp 625, most or all of the noise is cut off by the switch of the first continuous voltage ramp 625 from the second preliminary voltage ramp 614 to the first preliminary voltage ramp 604.

At a time t2, the end of the first time period 623 and the beginning of the second time period 624, a falling edge of the clock Clkp occurs along with a rising edge of the clock Clkn. As above, the fall of the clock Clkp and the rise of the clock Clkn at the time t2 are triggered by the comparator 510 when the output voltage ramp signal VrampC reaches or passes the end voltage Vend.

The fall of the clock Clkp causes the second ramp generator switch 516 to close, so that the current source 501 is electrically connected to the second capacitor node C2C and the second capacitor 504, thereby causing or allowing the current from the current source 501 to be applied to periodically charge the second capacitor 504 and, thus, to start the continuous ramping of the second preliminary voltage ramp 614. Additionally, the fall of the clock Clkp causes the second reset switch 506 to open, so that the second capacitor node C2C of the second capacitor 504 is not electrically connected to the reset voltage node 513 and the start voltage Vstart, thereby not interfering with the current from the current source 501 being applied to periodically charge the second capacitor 504. The second preliminary voltage ramp 614 starts ramping from the start voltage Vstart (i.e., the first voltage level 605), because immediately prior to the time t2, the clock Clkp was high, which held the second reset switch 506 closed, so that the second capacitor node C2C was electrically connected to the reset voltage node 513 and the start voltage Vstart. Additionally, since the clock Clkp was high immediately prior to the time t2, the second ramp generator switch 516 was open, so that the second capacitor node C2C was not electrically connected to the current source 501. Thus, the second reset switch 506 does not need to sink the current from the current source 501 to the source of the start voltage Vstart in order to reset the second preliminary voltage ramp signal Vc2c, as described above for the second current source 102. Instead, the open second ramp generator switch 516 prevents the current from being applied to charge the second capacitor 504 and prevents the second preliminary voltage ramp 614 from ramping prior to the time t2 or during the first time periods 623, so that the second reset switch 506 can hold the second capacitor node C2C to the start voltage Vstart. Therefore, the second reset switch 506 is closed during at least a portion of each of the first time periods 623 and is open during at least the second time periods 624, and the second ramp generator switch 516 is open during at least a portion of each of the first time periods 623 and is closed during at least the second time periods 624.

Additionally, at the time t2, the rise of the clock Clkn causes the second output switch 508 to close, so that the second capacitor node C2C is electrically connected to the output node 514, thereby causing the second preliminary voltage ramp 614 to be used to generate the second continuous voltage ramp 626 of the output voltage ramp signal VrampC. In other words, the closing of the second output switch 508 triggers the end of the previous first continuous voltage ramp 625 (at the end voltage Vend) of the output voltage ramp signal VrampC and a very quick reset of the output voltage ramp signal VrampC to the start voltage Vstart for the start of the second continuous voltage ramp 626. (The second output switch 508 is open during the first time periods 623 and closed during the second time periods 624.)

Furthermore, at the time t2, the rising edge of the clock Clkn causes the first reset switch 505 to close and the first ramp generator switch 515 to open, so that the first capacitor node C1C is electrically connected to the reset voltage node 513 and the start voltage Vstart but not to the current source 501, thereby causing the first capacitor 503 to be periodically discharged, and the first preliminary voltage ramp 604 at the first capacitor node C1C to be reset, to the start voltage Vstart, i.e., the reset voltage. Since the rising edge of the clock Clkn occurs at the time t2, the discharge of the first capacitor 503 occurs immediately after the quick reset for the start of the second continuous voltage ramp 626, so although the end of the previous first continuous voltage ramp 625 occurs very close to the beginning of the second preliminary voltage ramp 626, most or all of the noise is cut off by the switch of the second continuous voltage ramp 626 from the first preliminary voltage ramp 604 to the second preliminary voltage ramp 614.

At a time t3, the above process repeats as if at the time t1. In this manner, the ramp generator 500 multiplexes at each edge of the clock Clkp (or Clkn) between the preliminary voltage ramp signals Vc1c and Vc2c to generate the first and second continuous voltage ramps 625 and 626, respectively, of the output voltage ramp signal VrampC. The return or reset of the output voltage ramp signal VrampC at the end of each first and second continuous voltage ramp 625 and 626 occurs very rapidly and results in very little noise.

Additionally, since the open first and second ramp generator switches 515 and 516 eliminate any need for the closed first and second reset switch 505 and 506, respectively, to sink the current from the current source 501 to the source of the start voltage Vstart, the first and second reset switches 505 and 506 do not have to be large enough to handle the level of this current. Instead, the first and second reset switches 505 and 506 can be relatively small, as needed for a relatively small current. Additionally, in some embodiments, it is advantageous that the voltage level at the first and second capacitor nodes C1C and C2C has to be pulled down only to a positive voltage of the start voltage Vstart, instead of having to be pulled all the way down to zero, which would potentially result in additional noise and power consumption. Additionally, any noise that might be injected by the voltage pulldown to the start voltage Vstart has the entire non-ramp portion 603 or 613 to recover, so the reset of the first and second preliminary voltage ramps 604 and 614 can be done relatively slowly.

An additional benefit of having the positive voltage level for the start voltage Vstart is due to the downstream electronic component (e.g., an amplifier or the downstream comparator 111). The power supply for the downstream electronic component will likely be from ground (zero) to a maximum value. Many comparators, however, cannot reliably handle a lower voltage below a minimum value, such as about 500 millivolts, so the start voltage Vstart prevents the voltage level from dropping too low. For a similar reason, the end voltage Vend should not be above the maximum value of the power supply. The start voltage Vstart (e.g., about one volt) and the end voltage Vend (e.g., about two volts), therefore, place the output voltage ramp signal VrampC within the operating range (e.g., about zero to three volts) of the downstream electronic component.

Additionally, the first and second output switches 507 and 508 do not experience a very high current flow, since the downstream electronic component (e.g., an amplifier or the downstream comparator 111) typically does not pull much current. Therefore, the first and second output switches 507 and 508 can be relatively small, so that they inject very little noise into the output voltage ramp signal VrampC, as compared to a design that takes an output voltage ramp signal from a point immediately after the current sources and before the first and second ramp generator switches 515 and 516, such that the ramp generator switches would have to be relatively large to handle the level of the current and would potentially be a source of noise for the output voltage ramp signal.

The example embodiment of FIGS. 5 and 6 assumes that all of the voltage ramps are positive and that the voltage ramps start at a lower fixed voltage level. In other embodiments, however, the circuit can be inverted, with the current sources at the bottom and negative voltage ramps that start at an upper fixed voltage level. For such embodiments, FIGS. 5 and 6 represent an inverted schematic and inverted timing diagrams.

Figure 7:
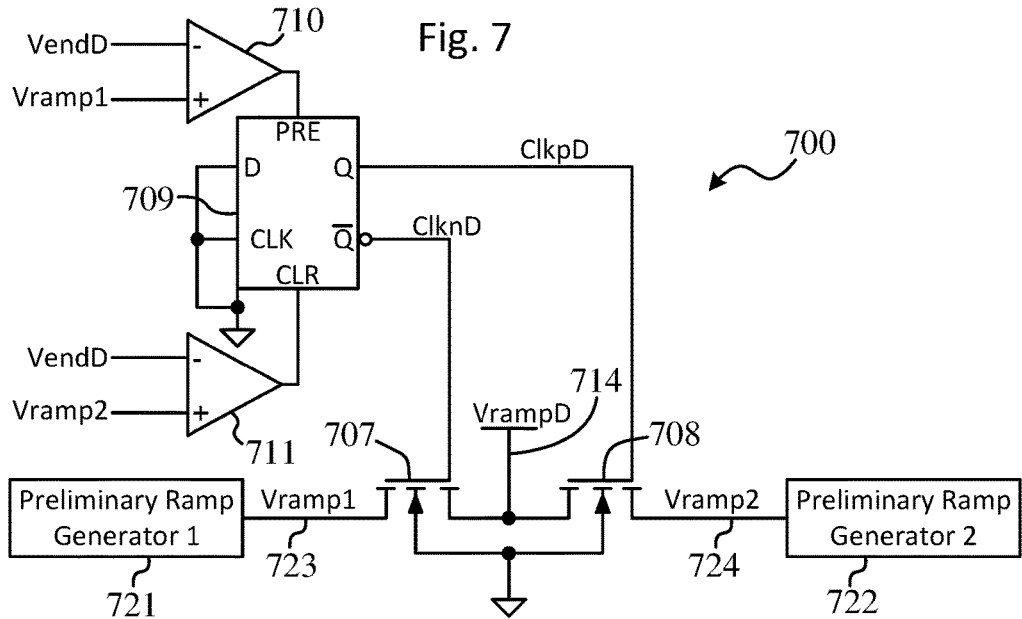
FIG. 7 is a simplified schematic diagram of an example improved ramp generator, in accordance with some embodiments.

An example improved ramp generator 700 is shown in FIG. 7, in accordance with some embodiments. The ramp generator 700 generally includes first and second output switches 707 and 708, a D flip-flop 709, first and second comparators 710 and 711, and first and second preliminary ramp generators 721 and 722, among other components not shown for simplicity. The ramp generator 700 generates an output voltage ramp signal VrampD at an output node 714, which ramps from a first (or start, initial, lower, minimum, or bottom) voltage level of a start voltage VstartD to a second (or end, final, upper, maximum, or top) voltage level of an end voltage VendD. Delays within some of the components of the ramp generator 700 may cause the second (or final, upper, or top) voltage level of the output voltage ramp signal VrampD not to be exactly the same as, but slightly greater than, the voltage level of the end voltage VendD. The output voltage ramp signal VrampD is typically provided to any appropriate downstream electronic component, e.g., an amplifier or the downstream comparator 111 (FIG. 1) that compares the output voltage ramp signal VrampD with a reference voltage Vref to generate a voltage pulse signal 112 (FIG. 1). For an application or circuit design that uses a relatively short duration voltage pulse (e.g., a few nanoseconds long) and/or that requires high precision in the rising and falling edges of the voltage pulse, the precision and linearity of the voltage ramp signal is of great importance in order to ensure that the comparator 111 is triggered at the precise required timing points. The output voltage ramp signal VrampD is a very precise and linear voltage ramp signal that can be used in such applications.

The first output switch 707 may be a MOSFET (e.g., NMOS) device with source and drain connected between the first preliminary ramp generator 721 and the output node 714, body connected to ground, and gate connected to a clock ClknD. The second output switch 708 may be a MOSFET (e.g., NMOS) device with source and drain connected between the second preliminary ramp generator 722 and the output node 714, body connected to ground, and gate connected to clock ClkpD.

The first and second comparators 710 and 711 are connected to receive the end voltage VendD at negative inputs thereof. The first comparator 710 is also connected to a first preliminary output node 723 (or first preliminary ramp node) to receive a first preliminary voltage ramp signal Vramp1 from the first preliminary ramp generator 721 at a positive input thereof. The second comparator 711 is also connected to a second preliminary output node 724 (or second preliminary ramp node) to receive a second preliminary voltage ramp signal Vramp2 from the second preliminary ramp generator 722 at a positive input thereof. An output of the first comparator 710 is connected to a preset input PRE of the D flip-flop 709. An output of the second comparator 711 is connected to a clear input CLR of the D flip-flop 709. An input D and a clock input CLK of the D flip-flop 709 are connected to ground. An output Q of the D flip-flop 709 produces the clock ClkpD, and an inverted output $\overline{Q}$ produces the clock ClknD. Thus, the clocks ClkpD and ClknD are inversions of each other.

In some embodiments, the first and second preliminary ramp generators 721 and 722 are any appropriate ramp generator circuit. For example, the first and second preliminary ramp generators 721 and 722 can each have a design like any of the ramp generators 100, 300 or 500, described above. Additionally, it is preferable that the first and second preliminary ramp generators 721 and 722 have the same design to ensure that the first and second preliminary voltage ramp signals Vramp1 and Vramp2 are almost identical to each other. Thus, the first and second preliminary voltage ramp signals Vramp1 and Vramp2 are like any of the output voltage ramp signals VrampA, VrampB or VrampC described above.

Generation of the first and second preliminary voltage ramp signals Vramp1 and Vramp2 and the output voltage ramp signal VrampD are described with reference to FIGS. 7-10.

Figure 8:
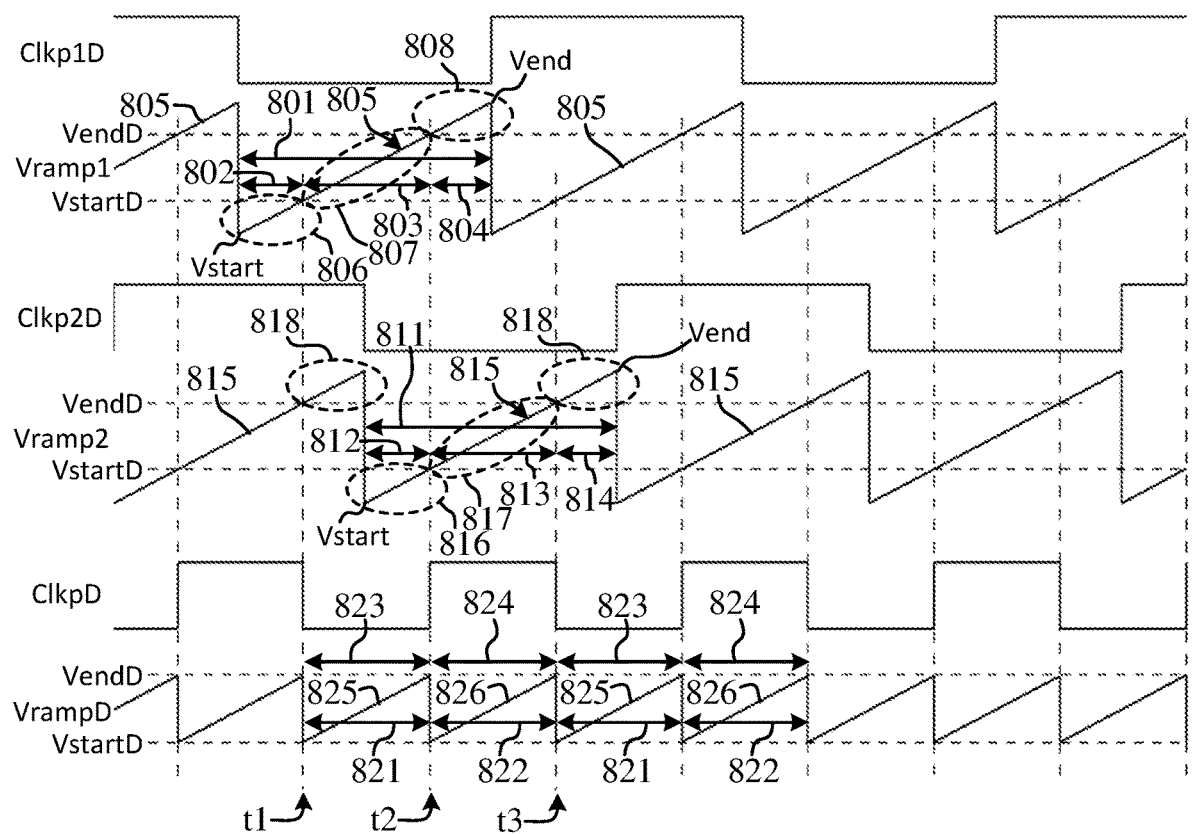
FIGS. 8-10 show example timing diagrams for operation of the example ramp generator shown in FIG. 7, in accordance with some embodiments.

In accordance with a first embodiment of FIG. 7, FIG. 8 shows example timing diagrams for the output voltage ramp signal VrampD, the first preliminary voltage ramp signal Vramp1, the second preliminary voltage ramp signal Vramp2, the clock ClkpD, and clocks Clkp1D and Clkp2D. (In some embodiments, the clock Clkp1D and the clock Clkp2D are like the clock Clkp2 in FIGS. 2 and 4 or the clock Clkp in FIG. 6, depending on the implementation of the first and second preliminary ramp generators 721 and 722.) Additionally, the clock ClknD is simply the inversion of the clock ClkpD, so its timing diagram is omitted for simplicity. The timing diagrams were generated by a simulation running at about 500 MHz with the start voltage VstartD at about 1.0 volt and the end voltage VendD at about 2.0 volts. Additionally, the preliminary start voltage Vstart and preliminary end voltage Vend (as described above for the ramp generator 100, 300 or 500) for the first and second preliminary ramp generators 721 and 722 were about 0.5 volts and 2.5 volts, respectively.

As shown in FIG. 8, in some embodiments, the first and second preliminary voltage ramp signals Vramp1 and Vramp2 have first and second preliminary ramp periods (e.g., 801 and 811, respectively) that are similar to the continuous ramp periods 221/222, 421/422 or 621/622, as described above. Each first and second preliminary voltage ramp (e.g., 805 and 815) (of the first and second preliminary voltage ramp signals Vramp1 and Vramp2, respectively) continuously and linearly ramps throughout the first and second preliminary ramp periods 801 and 811 from the first voltage level of the preliminary start voltage Vstart to the second voltage level of the preliminary end voltage Vend, as described above. (Since the first and second preliminary voltage ramp signals Vramp1 and Vramp2 are like any of the output voltage ramp signals VrampA, VrampB or VrampC, as described above, they generally have almost straight lines with almost no curve when reset or almost no noise at the start or end of the first and second preliminary voltage ramps 805 and 815.) The preliminary start voltage Vstart is the initial level at which the first and second preliminary voltage ramps 805 and 815 begin to ramp at the beginning of each first and second preliminary ramp period 801 and 811, as described above, and is shown as being less or lower than the start voltage VstartD (i.e., the first, start, initial, lower, minimum, or bottom voltage level of the output voltage ramp signal VrampD). The preliminary end voltage Vend is the final level at which the first and second preliminary voltage ramps 805 and 815 stop ramping at the end of each first and second preliminary ramp period 801 and 811, as described above, and is shown as being greater or higher than the end voltage VendD (i.e., the second, end, final, upper, maximum, or top voltage level of the output voltage ramp signal VrampD). Thus, the first and second preliminary voltage ramps 805 and 815 have an initial linear portion (e.g., 806 and 816) (i.e., between the preliminary start voltage Vstart and the start voltage VstartD, or within a first/initial portion 802 or 812 of the first or second preliminary ramp period 801 or 811), a middle linear portion (e.g., 807 and 817) (i.e., between the start voltage VstartD and the end voltage VendD, or within a second/middle portion 803 or 813 of the first or second preliminary ramp period 801 or 811), and a final linear portion (e.g., 808 and 818) (i.e., between the end voltage VendD and the preliminary end voltage Vend, or within a third/final portion 804 or 814 of the first or second preliminary ramp period 801 or 811). Additionally, except for being offset from each other, the second preliminary ramp periods 811 are about the same as the first preliminary ramp periods 801, the second preliminary voltage ramps 815 are about the same as the first preliminary voltage ramps 805, the initial portion 816 is about the same as the initial portion 806, the middle portion 817 is about the same as the middle portion 807, and the final portion 818 is about the same as the final portion 808.

In the illustrated example, the clock Clkp1D and the clock Clkp2D (which are 180 degrees out of phase with each other) have clock periods that are about twice the first and second preliminary ramp periods 801 and 811 (which are also 180 degrees out of phase with each other), respectively. Additionally, the duty cycle of the clocks Clkp1D and Clkp2D is shown as being about equal to 50%, such that the first and second preliminary voltage ramps 805 and 815 are about equal to each other. On the other hand, the clock ClkpD (and, thus, also the clock ClknD) has a clock period that is about the same as the preliminary ramp periods 801 and 811 and is shown with about a 50% duty cycle.

The output voltage ramp signal VrampD has first and second continuous output ramp periods (e.g., 821 and 822) during first and second time periods (e.g., 823 and 824), respectively. The first and second continuous output ramp periods 821 and 822 have first and second continuous output voltage ramps (e.g., 825 and 826), respectively, that continuously ramp from the first voltage level of the start voltage VstartD to the second voltage level of the end voltage VendD. The first and second time periods 823 and 824 (and, thus, also the first and second continuous output ramp periods 821 and 822 and the first and second continuous output voltage ramps 825 and 826) alternate with each other. The first time periods 823 correspond to the first half of the clock periods of the clock ClkpD (and the clock ClknD), and the second time periods 824 correspond to the second half of the clock periods of the clock ClkpD (and the clock ClknD).

The first continuous output ramp periods 821 and the first continuous output voltage ramps 825 correspond to the middle linear portion 807 of the first preliminary voltage ramps 805 and the second portion 803 of the first preliminary ramp period 801. The second continuous output ramp periods 822 and the first continuous output voltage ramps 826 correspond to the second middle portion 817 of the second preliminary voltage ramps 815 and the second portion 813 of the second preliminary ramp period 811.

Each of the first and second continuous output voltage ramps 825 and 826 continuously ramps from the start voltage VstartD to the end voltage VendD within the first and second continuous output ramp periods 821 and 822 (or the first and second time periods 823 and 824). The first continuous ramp periods 821 are produced from the first preliminary ramp periods 801 of the first preliminary voltage ramp signal Vramp 1 during the first time periods 823, although the first preliminary voltage ramps 805 continuously ramp not only during but also beyond (e.g., before and after, as shown) the first time periods 823. The second continuous ramp periods 822 are produced from the second preliminary ramp periods 811 of the second preliminary voltage ramp signal Vramp2 during the second time periods 824, although the second preliminary voltage ramps 815 continuously ramp not only during but also beyond (e.g., before and after, as shown) the second time periods 824. Thus, each of the first continuous voltage ramps 825 is produced from the middle linear portion 807 of the corresponding first preliminary voltage ramp 805, and each of the second continuous voltage ramps 826 is produced from the middle linear portion 817 of the corresponding second preliminary voltage ramp 815.

In some embodiments, the set of the switches 707 and 708 electrically connect the first preliminary output node 723 to the output node 714 to produce the first continuous output voltage ramps 825 during the first time periods 823, and electrically connect the second preliminary output node 724 to the output node 714 to produce the second continuous output voltage ramps 826 during the second time periods 824.

At a time t1, the beginning of one of the first time periods 823 and the end of a previous second time period 824, a falling edge of the clock ClkpD occurs along with a rising edge of the clock ClknD. The fall of the clock ClkpD and the rise of the clock ClknD at the time t1 are triggered by the second comparator 711. When the second preliminary voltage ramp signal Vramp2 reaches or passes the end voltage VendD, the second comparator 711 outputs a voltage pulse. The voltage pulse triggers the clear input CLR of the D flip-flop 709. Since the input D and the clock input CLK are connected to ground, the triggering of the clear input CLR causes the output Q to go low and the inverted output $\overline{Q}$ to go high, thereby resulting in a falling edge of the clock ClkpD and a rising edge of the clock ClknD whenever the second preliminary voltage ramp signal Vramp2 reaches or passes the end voltage VendD, or within an acceptable delay thereafter. Additionally, the later reset of the second preliminary voltage ramp signal Vramp2 causes the second comparator 711 to end the voltage pulse.

At the time t1, the rise of the clock ClknD causes the first output switch 707 to close, so that the first preliminary output node 723 is periodically electrically connected to the output node 714 during the first time periods 823, thereby causing the first preliminary voltage ramp 805 to be used to generate the first continuous voltage ramp 825 of the output voltage ramp signal VrampD. In other words, the closing of the first output switch 707 triggers the end of the previous second continuous voltage ramp 826 (at the end voltage VendD) of the output voltage ramp signal VrampD and a very quick reset of the output voltage ramp signal VrampD to the start voltage VstartD for the start of the first continuous voltage ramp 825. (The first output switch 707 is closed during the first time periods 823 and open during the second time periods 824.) The ramping of the first preliminary voltage ramp 805 had already started prior to the time t1, so the start voltage VstartD is the voltage level of the first preliminary voltage ramp 805 at the time t1 when the switch occurs from the previous second preliminary voltage ramp 815 to the first preliminary voltage ramp 805. Additionally, any noise that might have been generated at the start of the first preliminary voltage ramp 805 (i.e., in the initial linear portion 806 well before the first preliminary output node 723 is electrically connected to the output node 714) will have settled out during the initial portion 802 of the first preliminary ramp period 801. Furthermore, the fall of the clock ClkpD at the time t1 causes the second output switch 708 to open, so that the second preliminary output node 724 is not electrically connected to the output node 714, thereby ensuring that the continuation of the second preliminary voltage ramp signal Vramp2 into the final portion 818 thereof does not interfere with the generation of the first continuous voltage ramp 825. Also, since the second preliminary voltage ramp signal Vramp2 does not reset at the time t1, but continues into the final portion 818, the later reset of the second preliminary voltage ramp signal Vramp2 (well after the second preliminary output node 724 has been electrically disconnected from the output node 714) does not cause any noise in the first continuous voltage ramp 825.

At a time t2, the end of the first time period 823 and the beginning of the second time period 824, a falling edge of the clock ClknD occurs along with a rising edge of the clock ClkpD. The fall of the clock ClknD and the rise of the clock ClkpD at the time t2 are triggered by the first comparator 710. When the first preliminary voltage ramp signal Vramp1 reaches or passes the end voltage VendD, the first comparator 710 outputs a voltage pulse. The voltage pulse triggers the preset input PRE of the D flip-flop 709. Since the input D and the clock input CLK are connected to ground, the triggering of the preset input PRE causes the output Q to go high and the inverted output $\overline{Q}$ to go low, thereby resulting in a falling edge of the clock ClknD and a rising edge of the clock ClkpD whenever the first preliminary voltage ramp signal Vramp1 reaches or passes the end voltage VendD, or within an acceptable delay thereafter. Additionally, the reset of the first preliminary voltage ramp signal Vramp1 causes the second comparator 710 to end the voltage pulse.

At the time t2, the rise of the clock ClkpD causes the second output switch 708 to close, so that the second preliminary output node 724 is electrically connected to the output node 714 during the second time periods 824, thereby causing the second preliminary voltage ramp 815 to be used to generate the second continuous voltage ramp 826 of the output voltage ramp signal VrampD. In other words, the closing of the second output switch 708 triggers the end of the previous first continuous voltage ramp 825 (at the end voltage VendD) of the output voltage ramp signal VrampD and a very quick reset of the output voltage ramp signal VrampD to the start voltage VstartD for the start of the second continuous voltage ramp 826. (The second output switch 708 is open during the first time periods 823 and closed during the second time periods 824.) The ramping of the second preliminary voltage ramp 815 had already started prior to the time t2, so the start voltage VstartD is the voltage level of the second preliminary voltage ramp 815 at the time t2 when the switch occurs from the previous first preliminary voltage ramp 805 to the second preliminary voltage ramp 815. Additionally, any noise that might have been generated at the start of the second preliminary voltage ramp 815 (i.e., in the initial linear portion 816 well before the second preliminary output node 724 is electrically connected to the output node 714) will have settled out during the initial portion 812 of the second preliminary ramp period 811. Furthermore, the fall of the clock ClknD at the time t2 causes the first output switch 707 to open, so that the first preliminary output node 723 is not electrically connected to the output node 714, thereby ensuring that the continuation of the first preliminary voltage ramp signal Vramp1 into the final portion 808 thereof does not interfere with the generation of the second continuous voltage ramp 826. Also, since the first preliminary voltage ramp signal Vramp1 does not reset at the time t2, but continues into the final portion 808, the later reset of the first preliminary voltage ramp signal Vramp1 (well after the first preliminary output node 723 has been electrically disconnected from the output node 714) does not cause any noise in the second continuous voltage ramp 826.

At a time t3, the above process repeats as if at the time t1. In this manner, the ramp generator 700 multiplexes at each edge of the clock ClkpD (or ClknD) between the first and second preliminary voltage ramp signals Vramp1 and Vramp2 to generate the first and second continuous voltage ramps 825 and 826, respectively, of the output voltage ramp signal VrampD. The return or reset of the output voltage ramp signal VrampD at the end of each first and second continuous voltage ramp 825 and 826 occurs very rapidly and results in very little noise. Additionally, the first and second continuous voltage ramps 825 and 826 exhibit a very high degree of linearity, potentially even higher than that of the first and second continuous voltage ramps 225, 226, 425, 426, 625 and 626, due to the fact that the first and second continuous voltage ramps 825 and 826 are taken from the middle linear portions 807 and 817 (a linear "sweet spot") of the first and second preliminary voltage ramps 805 and 815, well separated from the reset points thereof, and where linearity of the first and second preliminary voltage ramps 805 and 815 is ensured.

Additionally, the first and second output switches 707 and 708 do not experience a very high current flow, since the downstream electronic component (e.g., an amplifier or the downstream comparator 111) typically does not pull much current. Therefore, the first and second output switches 707 and 708 can be relatively small, so that they inject very little noise into the output voltage ramp signal VrampD.

The example embodiment of FIGS. 7 and 8 assumes that all of the voltage ramps are positive and that the voltage ramps start at a lower fixed voltage level. In other embodiments, however, the circuit can be inverted, with the current sources at the bottom and negative voltage ramps that start at an upper fixed voltage level. For such embodiments, FIGS. 7 and 8 represent an inverted schematic and inverted timing diagrams.

Figure 9:
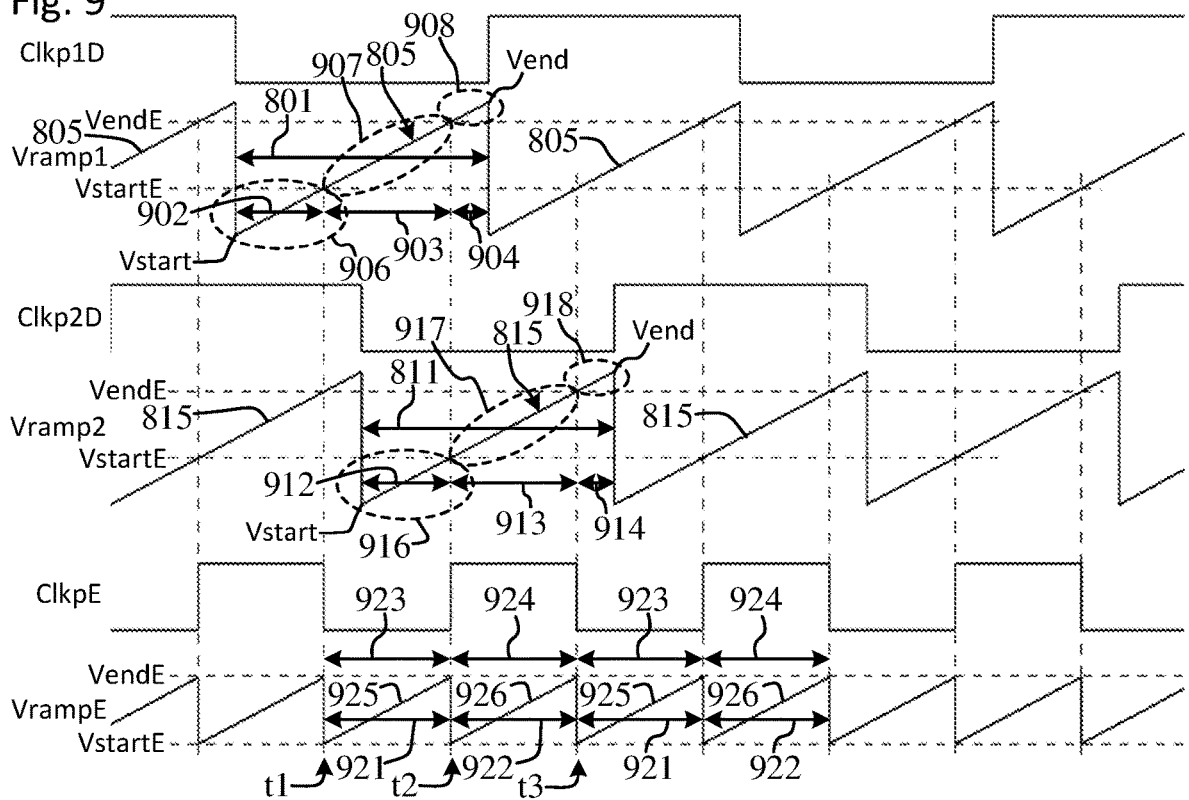

In accordance with a second embodiment of FIG. 7, FIG. 9 shows alternative example timing diagrams for an output voltage ramp signal VrampE, the first preliminary voltage ramp signal Vramp1, the second preliminary voltage ramp signal Vramp2, a clock ClkpE, and clocks Clkp1D and Clkp2D. Additionally, a clock ClknE is simply the inversion of the clock ClkpE, so its timing diagram is omitted for simplicity. The output voltage ramp signal VrampE, the clock ClkpE, and the clock ClknE take the place of the output voltage ramp signal VrampD, the clock ClkpD, and the clock ClknD, respectively, in the above description of FIGS. 7 and 8; but the first preliminary voltage ramp signal Vramp1, the second preliminary voltage ramp signal Vramp2, and clocks Clkp1D and Clkp2D remain the same as described above with respect to FIGS. 7 and 8. The timing diagrams were generated by a simulation running at about 500 MHz with the start voltage VstartE at about 1.2 volt and the end voltage VendE at about 2.2 volts. Additionally, the preliminary start voltage Vstart and preliminary end voltage Vend (as described above for the ramp generator 100, 300 or 500) for the first and second preliminary ramp generators 721 and 722 were about 0.5 volts and 2.5 volts, respectively.

As shown in FIG. 9, in some embodiments, the first and second preliminary voltage ramp signals Vramp 1 and Vramp2 have the first and second preliminary ramp periods 801 and 811, respectively, with the first and second preliminary voltage ramps 805 and 815, respectively, as described above with respect to FIG. 8. The preliminary start voltage Vstart, described above, is shown as being less or lower than the start voltage VstartE (i.e., the first, start, initial, lower, minimum, or bottom voltage level of the output voltage ramp signal VrampE). The preliminary end voltage Vend, described above, is shown as being greater or higher than the end voltage VendE (i.e., the second, end, final, upper, maximum, or top voltage level of the output voltage ramp signal VrampE). Thus, the first and second preliminary voltage ramps 805 and 815 have an initial linear portion (e.g., 906 and 916) (i.e., between the preliminary start voltage Vstart and the start voltage VstartE, or within a first/initial portion 902 or 912 of the first or second preliminary ramp period 801 or 811), a middle linear portion (e.g., 907 and 917) (i.e., between the start voltage VstartE and the end voltage VendE, or within a second/middle portion 903 or 913 of the first or second preliminary ramp period 801 or 811), and a final linear portion (e.g., 908 and 918) (i.e., between the end voltage VendE and the preliminary end voltage Vend, or within a third/final portion 904 or 914 of the first or second preliminary ramp period 801 or 811). Additionally, except for being offset from each other, the initial portion 916 is about the same as the initial portion 906, the middle portion 917 is about the same as the middle portion 907, and the final portion 918 is about the same as the final portion 908.

Similar to the clock ClkpD, the clock ClkpE (and, thus, also the clock ClknE) has a clock period that is about the same as the preliminary ramp periods 801 and 811 and is shown with about a 50% duty cycle.

The output voltage ramp signal VrampE has first and second continuous output ramp periods (e.g., 921 and 922) during first and second time periods (e.g., 923 and 924), respectively. The first and second continuous output ramp periods 921 and 922 have first and second continuous output voltage ramps (e.g., 925 and 926), respectively, that continuously ramp from the first voltage level of the start voltage VstartE to the second voltage level of the end voltage VendE. The first and second time periods 923 and 924 (and, thus, also the first and second continuous output ramp periods 921 and 922 and the first and second continuous output voltage ramps 925 and 926) alternate with each other. The first time periods 923 correspond to the first half of the clock periods of the clock ClkpE (and the clock ClknD), and the second time periods 924 correspond to the second half of the clock periods of the clock ClkpE (and the clock ClknE).

The first continuous output ramp periods 921 and the first continuous output voltage ramps 925 correspond to the middle linear portion 907 of the first preliminary voltage ramps 805 and the second portion 903 of the first preliminary ramp period 801. The second continuous output ramp periods 922 and the first continuous output voltage ramps 926 correspond to the second middle portion 917 of the second preliminary voltage ramps 815 and the second portion 913 of the second preliminary ramp period 811.

Each of the first and second continuous output voltage ramps 925 and 926 continuously ramps from the start voltage VstartE to the end voltage VendE within the first and second continuous output ramp periods 921 and 922 (or the first and second time periods 923 and 924). The first continuous ramp periods 921 are produced from the first preliminary ramp periods 801 of the first preliminary voltage ramp signal Vramp 1 during the first time periods 923, although the first preliminary voltage ramps 805 continuously ramp not only during but also beyond (e.g., before and after, as shown) the first time periods 923. The second continuous ramp periods 922 are produced from the second preliminary ramp periods 811 of the second preliminary voltage ramp signal Vramp2 during the second time periods 924, although the second preliminary voltage ramps 815 continuously ramp not only during but also beyond (e.g., before and after, as shown) the second time periods 924. Thus, each of the first continuous voltage ramps 925 is produced from the middle linear portion 907 of the corresponding first preliminary voltage ramp 805, and each of the second continuous voltage ramps 926 is produced from the middle linear portion 917 of the corresponding second preliminary voltage ramp 815.

In some embodiments, the set of the switches 707 and 708 electrically connect the first preliminary output node 723 to the output node 714 to produce the first continuous output voltage ramps 925 during the first time periods 923, and electrically connect the second preliminary output node 724 to the output node 714 to produce the second continuous output voltage ramps 926 during the second time periods 924.

The above described actions that occur at the times t1, t2 and t3 in FIG. 8 are generally the same or similar to the actions that occur at the times t1, t2 and t3 in FIG. 9. However, the end voltage VendE is greater or higher than the end voltage VendD of FIG. 8. Therefore, the first and second preliminary voltage ramps 805 and 815 cross the end voltage VendE later than was the case for crossing the end voltage VendD in FIG. 8. As a result, the start voltage VstartE is also greater or higher than the start voltage VstartD, and the clock ClkpE and the clock ClknE are delayed relative to the clock ClkpD and the clock ClknD, respectively. As a further result, the continuous ramp periods 921/922, the time periods 923/924, and the continuous output voltage ramps 925/926 of FIG. 9 are similarly delayed relative to the continuous ramp periods 821/822, the time periods 823/824, and the continuous output voltage ramps 825/826 of FIG. 8. Additionally, the middle linear portions 907 and 917 (of the corresponding first and second preliminary voltage ramps 805 and 815, and from which the first and second continuous output voltage ramps 925 and 926 are produced) are closer to the end voltage Vend than are the middle linear portions 807 and 817. Thus, the final portions 908 and 918 are smaller than the final portions 808 and 818, the initial portions 906 and 916 are larger than the initial portions 806 and 816, and the initial portions 906 and 916 are larger than the final portions 908 and 918.

The example embodiment of FIGS. 7 and 9 assumes that all of the voltage ramps are positive and that the voltage ramps start at a lower fixed voltage level. In other embodiments, however, the circuit can be inverted, with the current sources at the bottom and negative voltage ramps that start at an upper fixed voltage level. For such embodiments, FIGS. 7 and 9 represent an inverted schematic and inverted timing diagrams.

Figure 10:
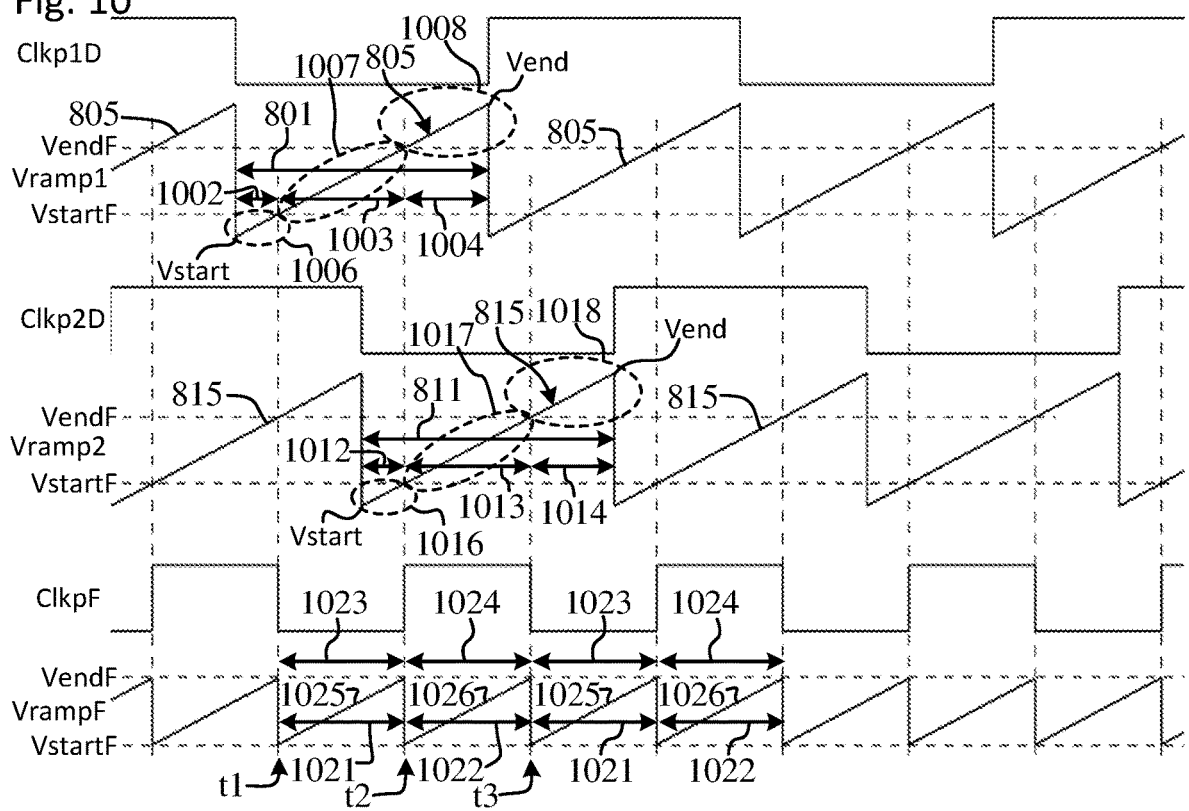

In accordance with a third embodiment of FIG. 7, FIG. 10 shows alternative example timing diagrams for an output voltage ramp signal VrampF, the first preliminary voltage ramp signal Vramp1, the second preliminary voltage ramp signal Vramp2, a clock ClkpF, and the clocks Clkp1D and Clkp2D. Additionally, a clock ClknF is simply the inversion of the clock ClkpF, so its timing diagram is omitted for simplicity. The output voltage ramp signal VrampF, the clock ClkpF, and the clock ClknF take the place of the output voltage ramp signal VrampD, the clock ClkpD, and the clock ClknD, respectively, in the above description of FIGS. 7 and 8; but the first preliminary voltage ramp signal Vramp1, the second preliminary voltage ramp signal Vramp2, and clocks Clkp1D and Clkp2D remain the same as described above with respect to FIGS. 7 and 8. The timing diagrams were generated by a simulation running at about 500 MHz with the start voltage VstartF at about 0.8 volts and the end voltage VendF at about 1.8 volts. Additionally, the preliminary start voltage Vstart and preliminary end voltage Vend (as described above for the ramp generator 100, 300 or 500) for the first and second preliminary ramp generators 721 and 722 were about 0.5 volts and 2.5 volts, respectively.

As shown in FIG. 10, in some embodiments, the first and second preliminary voltage ramp signals Vramp1 and Vramp2 have the first and second preliminary ramp periods 801 and 811, respectively, with the first and second preliminary voltage ramps 805 and 815, respectively, as described above. The preliminary start voltage Vstart, described above, is shown as being less or lower than the start voltage VstartF (i.e., the first, start, initial, lower, minimum, or bottom voltage level of the output voltage ramp signal VrampF). The preliminary end voltage Vend, described above, is shown as being greater or higher than the end voltage VendF (i.e., the second, end, final, upper, maximum, or top voltage level of the output voltage ramp signal VrampF). Thus, the first and second preliminary voltage ramps 805 and 815 have an initial linear portion (e.g., 1006 and 1016) (i.e., between the preliminary start voltage Vstart and the start voltage VstartF, or within a first/initial portion 1002 or 1012 of the first or second preliminary ramp period 801 or 811), a middle linear portion (e.g., 1007 and 1017) (i.e., between the start voltage VstartF and the end voltage VendF, or within a second/middle portion 1003 or 1013 of the first or second preliminary ramp period 801 or 811), and a final linear portion (e.g., 1008 and 1018) (i.e., between the end voltage VendF and the preliminary end voltage Vend, or within a third/final portion 1004 or 1014 of the first or second preliminary ramp period 801 or 811). Additionally, except for being offset from each other, the initial portion 1016 is about the same as the initial portion 1006, the middle portion 1017 is about the same as the middle portion 1007, and the final portion 1018 is about the same as the final portion 1008.

Similar to the clock ClkpD, the clock ClkpF (and, thus, also the clock ClknF) has a clock period that is about the same as the preliminary ramp periods 801 and 811 and is shown with about a 50% duty cycle.

The output voltage ramp signal VrampF has first and second continuous output ramp periods (e.g., 1021 and 1022) during first and second time periods (e.g., 1023 and 1024), respectively. The first and second continuous output ramp periods 1021 and 1022 have first and second continuous output voltage ramps (e.g., 1025 and 1026), respectively, that continuously ramp from the first voltage level of the start voltage VstartF to the second voltage level of the end voltage VendF. The first and second time periods 1023 and 1024 (and, thus, also the first and second continuous output ramp periods 1021 and 1022 and the first and second continuous output voltage ramps 1025 and 1026) alternate with each other. The first time periods 1023 correspond to the first half of the clock periods of the clock ClkpF (and the clock ClknD), and the second time periods 1024 correspond to the second half of the clock periods of the clock ClkpF (and the clock ClknF).

The first continuous output ramp periods 1021 and the first continuous output voltage ramps 1025 correspond to the middle linear portion 1007 of the first preliminary voltage ramps 805 and the second portion 1003 of the first preliminary ramp period 801. The second continuous output ramp periods 1022 and the first continuous output voltage ramps 1026 correspond to the second middle portion 1017 of the second preliminary voltage ramps 815 and the second portion 1013 of the second preliminary ramp period 811.

Each of the first and second continuous output voltage ramps 1025 and 1026 continuously ramps from the start voltage VstartF to the end voltage VendF within the first and second continuous output ramp periods 1021 and 1022 (or the first and second time periods 1023 and 1024). The first continuous ramp periods 1021 are produced from the first preliminary ramp periods 801 of the first preliminary voltage ramp signal Vramp 1 during the first time periods 1023, although the first preliminary voltage ramps 805 continuously ramp not only during but also beyond (e.g., before and after, as shown) the first time periods 1023. The second continuous ramp periods 1022 are produced from the second preliminary ramp periods 811 of the second preliminary voltage ramp signal Vramp2 during the second time periods 1024, although the second preliminary voltage ramps 815 continuously ramp not only during but also beyond (e.g., before and after, as shown) the second time periods 1024. Thus, each of the first continuous voltage ramps 1025 is produced from the middle linear portion 1007 of the corresponding first preliminary voltage ramp 805, and each of the second continuous voltage ramps 1026 is produced from the middle linear portion 1017 of the corresponding second preliminary voltage ramp 815.

In some embodiments, the set of the switches 707 and 708 electrically connect the first preliminary output node 723 to the output node 714 to produce the first continuous output voltage ramps 1025 during the first time periods 1023, and electrically connect the second preliminary output node 724 to the output node 714 to produce the second continuous output voltage ramps 1026 during the second time periods 1024.

The above described actions that occur at the times t1, t2 and t3 in FIG. 8 are generally the same or similar to the actions that occur at the times t1, t2 and t3 in FIG. 10. However, the end voltage VendF is less or lower than the end voltage VendD of FIG. 8. Therefore, the first and second preliminary voltage ramps 805 and 815 cross the end voltage VendF earlier than was the case for crossing the end voltage VendD in FIG. 8. As a result, the start voltage VstartF is also less or lower than the start voltage VstartD, and the clock ClkpF and the clock ClknF are earlier relative to the clock ClkpD and the clock ClknD, respectively. As a further result, the continuous ramp periods 1021/1022, the time periods 1023/1024, and the continuous output voltage ramps 1025/1026 of FIG. 10 are similarly earlier relative to the continuous ramp periods 821/822, the time periods 823/824, and the continuous output voltage ramps 825/826 of FIG. 8. Additionally, the middle linear portions 1007 and 1017 (of the corresponding first and second preliminary voltage ramps 805 and 815, and from which the first and second continuous output voltage ramps 1025 and 1026 are produced) are closer to the start voltage Vstart than are the middle linear portions 807 and 817. Thus, the final portions 1008 and 1018 are larger than the final portions 808 and 818, the initial portions 1006 and 1016 are smaller than the initial portions 806 and 816, and the final portions 1008 and 1018 are larger than the initial portions 1006 and 1016.

The example embodiment of FIGS. 7 and 10 assumes that all of the voltage ramps are positive and that the voltage ramps start at a lower fixed voltage level. In other embodiments, however, the circuit can be inverted, with the current sources at the bottom and negative voltage ramps that start at an upper fixed voltage level. For such embodiments, FIGS. 7 and 10 represent an inverted schematic and inverted timing diagrams.

Whereas the embodiment of FIG. 8 takes the first and second continuous output voltage ramps 825 and 826 from almost a center portion of the corresponding first and second preliminary voltage ramps 805 and 815, embodiments of FIG. 9 take the first and second continuous output voltage ramps 925 and 926 from a later portion of the corresponding first and second preliminary voltage ramps 905 and 915 that is closer to the end voltage Vend, and embodiments of FIG. 10 take the first and second continuous output voltage ramps 1025 and 1026 from a later portion of the corresponding first and second preliminary voltage ramps 1005 and 1015 that is closer to the start voltage Vstart. Additionally, in some embodiments, the first and second continuous output voltage ramps 925 and 926 can be taken from a portion of the corresponding first and second preliminary voltage ramps 905 and 915 that is all the way towards the end voltage Vend (such that the final portions 908 and 918 are almost nonexistent), or the first and second continuous output voltage ramps 1025 and 1026 can be taken from a portion of the corresponding first and second preliminary voltage ramps 1005 and 1015 that is all the way towards the start voltage Vstart (such that the final portions 1008 and 1018 are almost nonexistent). In other words, the embodiments of FIGS. 8, 9 and 10 illustrate that the first and second continuous output voltage ramps 825/826, 925/926 or 1025/1026 can be taken from any appropriate or desired portion of the corresponding first and second preliminary voltage ramps 805/815, 905/915 or 1005/1015 by setting the end voltage VendD, VendE or VendF at a corresponding voltage level. Therefore, the most linear portion of the first and second preliminary voltage ramps 805/815, 905/915 or 1005/1015 (i.e., the portion that is more linear than the rest) can be selected and used to form the first and second continuous output voltage ramps 825/826, 925/926 or 1025/1026.

Reference has been made in detail to embodiments of the disclosed invention, one or more examples of which have been illustrated in the accompanying figures. Each example has been provided by way of explanation of the present technology, not as a limitation of the present technology. In fact, while the specification has been described in detail with respect to specific embodiments of the invention, it will be appreciated that those skilled in the art, upon attaining an understanding of the foregoing, may readily conceive of alterations to, variations of, and equivalents to these embodiments. For instance, features illustrated or described as part of one embodiment may be used with another embodiment to yield a still further embodiment. Thus, it is intended that the present subject matter covers all such modifications and variations within the scope of the appended claims and their equivalents. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

What is claimed is:

1. A ramp generator comprising:
an output node at which an output voltage ramp signal is produced, the output voltage ramp signal having a repeating series of continuous ramp periods produced during a corresponding repeating series of time periods; and
a plurality of preliminary ramp nodes at which a corresponding plurality of preliminary voltage ramp signals are generated, each preliminary voltage ramp signal of the plurality of preliminary voltage ramp signals continuously ramping during a corresponding time period of the repeating series of time periods, each continuous ramp period of the repeating series of continuous ramp periods being produced from a corresponding preliminary voltage ramp signal of the plurality of preliminary voltage ramp signals when a corresponding preliminary ramp node of the plurality of preliminary ramp nodes is periodically electrically connected to the output node during the corresponding time period of the repeating series of time periods.

2. The ramp generator of claim 1, wherein:
each continuous ramp period of the repeating series of continuous ramp periods has a corresponding continuous voltage ramp that is produced from an initial linear portion of a corresponding preliminary voltage ramp of the corresponding preliminary voltage ramp signal that continuously ramps during the corresponding time period.

3. The ramp generator of claim 1, wherein:
each preliminary voltage ramp signal has a corresponding preliminary voltage ramp that continuously ramps during and after the corresponding time period.

4. The ramp generator of claim 1, wherein:
each continuous ramp period of the output voltage ramp signal has an output voltage ramp that continuously ramps from a first voltage level to a second voltage level that is greater than the first voltage level; and
each preliminary voltage ramp signal has a corresponding preliminary voltage ramp that continuously ramps from the first voltage level to greater than the second voltage level.

5. The ramp generator of claim 1, wherein:
each continuous ramp period of the repeating series of continuous ramp periods has a continuous voltage ramp that is produced from a middle linear portion of a corresponding preliminary voltage ramp of the corresponding preliminary voltage ramp signal.

6. The ramp generator of claim 5, wherein:
each corresponding preliminary voltage ramp also has an initial portion and a final portion from which a corresponding continuous voltage ramp is not produced, the middle linear portion being after the initial portion and before the final portion, and the initial portion being larger than the final portion.

7. The ramp generator of claim 5, wherein:
each corresponding preliminary voltage ramp also has an initial portion and a final portion from which a corresponding continuous voltage ramp is not produced, the middle linear portion being after the initial portion and before the final portion, and the final portion being larger than the initial portion.

8. The ramp generator of claim 1, wherein:
each preliminary voltage ramp signal has a corresponding preliminary voltage ramp the continuously ramps before, during and after the corresponding time period.

9. The ramp generator of claim 1, wherein:
each continuous ramp period of the output voltage ramp signal has an output voltage ramp that continuously ramps from a first voltage level to a second voltage level that is greater than the first voltage level; and
each preliminary voltage ramp signal has a corresponding preliminary voltage ramp that continuously ramps from less than the first voltage level to greater than the second voltage level.

10. The ramp generator of claim 1, wherein:
each preliminary voltage ramp signal has a corresponding preliminary voltage ramp that continuously ramps before and during the corresponding time period.

11. A ramp generator comprising:
an output node at which an output voltage ramp signal is produced, the output voltage ramp signal having a repeating series of continuous output voltage ramps during a corresponding repeating series of time periods;
a plurality of capacitors, each capacitor of the plurality of capacitors having a corresponding capacitor node of a plurality of capacitor nodes at which a corresponding preliminary voltage ramp signal of a plurality of preliminary voltage ramp signals is generated;
a plurality of current sources, each current source of the plurality of current sources being electrically connected to a corresponding capacitor of the plurality of capacitors at the corresponding capacitor node, each current source generating the corresponding preliminary voltage ramp signal by periodically charging the corresponding capacitor to generate a corresponding preliminary voltage ramp of a plurality of preliminary voltage ramps; and
a set of switches that enable generation of the plurality of preliminary voltage ramps during the repeating series of time periods, and that individually electrically connect the plurality of capacitor nodes in sequence to the output node to produce the repeating series of continuous output voltage ramps during the repeating series of time periods.

12. The ramp generator of claim 11, wherein the set of switches comprises:
a plurality of reset switches, each reset switch of the plurality of reset switches being closed during a portion of a corresponding time period of the repeating series of time periods and being open during a non-corresponding time period of the repeating series of time periods, each reset switch electrically connecting a corresponding capacitor node and a reset voltage source to set the corresponding capacitor node to a reset voltage by discharging the corresponding capacitor to the reset voltage when the reset switch is closed and to enable a corresponding current source of the plurality of current sources to charge the corresponding capacitor to generate the corresponding preliminary voltage ramp when the reset switch is open; and
a plurality of output switches, each output switch of the plurality of output switches being closed during a corresponding time period of the repeating series of time periods and open during a non-corresponding time period of the repeating series of time periods, each output switch electrically connecting a corresponding capacitor node and the output node to produce a corresponding continuous output voltage ramp of the repeating series of continuous output voltage ramps at the output node from the corresponding preliminary voltage ramp when the output switch is closed.

13. The ramp generator of claim 12, wherein:
a duty cycle of clock signals for opening and closing the plurality of reset switches is less than 50%; and
a duty cycle of a clock signal for opening and closing the plurality of output switches is about 50%.

14. The ramp generator of claim 12, wherein:
each reset switch of the plurality of reset switches sinks a corresponding current from the corresponding current source when the reset switch is closed and upon discharging the corresponding capacitor to the reset voltage.

15. The ramp generator of claim 12, wherein the set of switches further comprises:
a plurality of ramp generator switches, each ramp generator switch of the plurality of ramp generator switches being closed during a corresponding time period of the repeating series of time periods and being open during a portion of a non-corresponding time period of the repeating series of time periods, each ramp generator switch electrically connecting a corresponding capacitor node and the corresponding current source to generate the corresponding preliminary voltage ramp when the ramp generator switch is closed.

16. The ramp generator of claim 15, wherein:
a duty cycle of clock signals for opening and closing the plurality of reset switches and for closing and opening the plurality of ramp generator switches is less than 50%; and
a duty cycle of a clock signal for opening and closing the plurality of output switches is about 50%.

17. A ramp generator comprising:
an output node at which an output voltage ramp signal is produced, the output voltage ramp signal having a repeating series of continuous ramp periods, each continuous ramp period of the repeating series of continuous ramp periods being produced from a corresponding preliminary ramp period of a plurality of preliminary ramp periods of a plurality of preliminary voltage ramp signals during a corresponding repeating series of time periods; and
a plurality of capacitors, each capacitor of the plurality of capacitors having a corresponding capacitor node of a plurality of capacitor nodes, each preliminary voltage ramp signal of the plurality of preliminary voltage ramp signals being generated at a corresponding one of the plurality of capacitor nodes, each one of the plurality of capacitor nodes periodically electrically connecting in sequence to the output node, each preliminary ramp period of the plurality of preliminary ramp periods having a corresponding preliminary voltage ramp of the plurality of preliminary voltage ramp signals that continuously ramps by charging a corresponding capacitor of the plurality of capacitors in sequence during a corresponding time period of the repeating series of time periods, and each preliminary voltage ramp resetting to a nonzero initial voltage by partially discharging the corresponding capacitor during a non-corresponding time period of the repeating series of time periods.

18. The ramp generator of claim 17, further comprising:
a plurality of current sources, each current source of the plurality of current sources electrically connected to a corresponding capacitor of the plurality of capacitors at the corresponding capacitor node to generate a corresponding preliminary voltage ramp signal by periodically charging the corresponding capacitor to generate the corresponding preliminary voltage ramp of the corresponding preliminary ramp period;
a plurality of reset switches, each reset switch of the plurality of reset switches being closed during a portion of a corresponding time period of the repeating series of time periods and being open during a non-corresponding time period of the repeating series of time periods, each reset switch electrically connecting the corresponding capacitor node and a reset voltage source to set the corresponding capacitor node to the nonzero initial voltage by discharging the corresponding capacitor to the nonzero initial voltage when the reset switch is closed, to sink a corresponding current from a corresponding current source when a corresponding reset switch is closed and upon discharging the corresponding capacitor to the nonzero initial voltage, and to enable the corresponding current source to charge the corresponding capacitor to generate the corresponding preliminary voltage ramp when the reset switch is open; and
a plurality of output switches, each output switch of the plurality of output switches being closed during a corresponding time period of the repeating series of time periods and open during a non-corresponding time period of the repeating series of time periods, each output switch electrically connecting a corresponding capacitor node and the output node to produce a corresponding continuous output voltage ramp of a corresponding continuous ramp period of the repeating series of continuous ramp periods at the output node from the corresponding preliminary voltage ramp when a corresponding output switch is closed.

19. The ramp generator of claim 17, further comprising:
a plurality of current sources;
a plurality of ramp generator switches, each ramp generator switch of the plurality of ramp generator switches being closed during a corresponding time period of the repeating series of time periods and being open during a portion of a non-corresponding time period of the repeating series of time periods, each ramp generator switch electrically connecting a corresponding capacitor node and a corresponding current source to generate the corresponding preliminary voltage ramp when the ramp generator switch is closed;
a plurality of reset switches, each reset switch of the plurality of reset switches being closed during a portion of a corresponding time period of the repeating series of time periods and being open during a non-corresponding time period of the repeating series of time periods, each reset switch electrically connecting a corresponding capacitor node and a reset voltage source to set the corresponding capacitor node to the nonzero initial voltage by discharging the corresponding capacitor to the nonzero initial voltage when the reset switch is closed and to enable the corresponding current source to charge the corresponding capacitor to generate the corresponding preliminary voltage ramp when the reset switch is open; and
a plurality of output switches, each output switch of the plurality of output switches being closed during a corresponding time period of the repeating series of time periods and open during a non-corresponding time period of the repeating series of time periods, each output switch electrically connecting the corresponding capacitor node and the output node to produce a corresponding continuous output voltage ramp of a corresponding continuous ramp period of the repeating series of continuous ramp periods at the output node from the corresponding preliminary voltage ramp when the output switch is closed.

20. The ramp generator of claim 17, further comprising:

a current source;

a plurality of ramp generator switches, each ramp generator switch of the plurality of ramp generator switches being closed during a corresponding time period of the repeating series of time periods and being open during a non-corresponding time period of the repeating series of time periods, each ramp generator switch electrically connecting a corresponding capacitor node and the current source to generate the corresponding preliminary voltage ramp when the ramp generator switch is closed;

a plurality of reset switches, each reset switch of the plurality of reset switches being closed during a corresponding time period of the repeating series of time periods and being open during a non-corresponding time period of the repeating series of time periods, each reset switch electrically connecting a corresponding capacitor node and a reset voltage source to set the corresponding capacitor node to the nonzero initial voltage by discharging the corresponding capacitor to the nonzero initial voltage when the reset switch is closed and to enable the current source to charge the corresponding capacitor to generate the corresponding preliminary voltage ramp when the reset switch is open; and a plurality of output switches, each output switch of the plurality of output switches being closed during a corresponding time period of the repeating series of time periods and open during a non-corresponding time period of the repeating series of time periods, each output switch electrically connecting a corresponding capacitor node and the output node to produce a corresponding continuous output voltage ramp of a corresponding continuous ramp period at the output node from the corresponding preliminary voltage ramp when the output switch is closed.

\* \* \* \* \*